United States Patent
Tomisaki et al.

(10) Patent No.: US 6,696,687 B1
(45) Date of Patent: Feb. 24, 2004

(54) RADIATION DETECTOR

(75) Inventors: Takayuki Tomisaki, Otawara (JP); Michitaka Honda, Yaita (JP); Seiichiro Nagai, Otawara (JP); Manabu Tanaka, Otawara (JP); Takuya Sakaguchi, Otawara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/550,800

(22) Filed: Apr. 18, 2000

(30) Foreign Application Priority Data

Jun. 7, 1999 (JP) .............................. 11-160213
Apr. 10, 2000 (JP) ........................... 2000-108099

(51) Int. Cl.[7] .............................................. H01L 31/00
(52) U.S. Cl. .................... 250/370.09; 378/97; 378/98.8
(58) Field of Search ..................... 250/370.09; 378/97, 378/98.8

(56) References Cited

U.S. PATENT DOCUMENTS

| | | | | |
|---|---|---|---|---|
| 3,949,162 A | * | 4/1976 | Malueg | ...................... 348/245 |
| 4,827,145 A | * | 5/1989 | Arques | ...................... 378/98.8 |
| 5,319,206 A | * | 6/1994 | Lee et al. | ............... 250/370.09 |
| 5,574,765 A | * | 11/1996 | Hassler et al. | ............. 378/98.8 |
| 5,648,660 A | * | 7/1997 | Lee et al. | ............... 250/370.09 |
| 5,818,898 A | | 10/1998 | Tsukamoto et al. | |

FOREIGN PATENT DOCUMENTS

| | | |
|---|---|---|
| EP | 0 788 277 | 8/1997 |
| GB | 2 318 473 | 4/1998 |
| JP | 01-276887 | 11/1989 |
| JP | 06-105069 | 4/1994 |
| JP | 06-113136 | 4/1994 |
| JP | 09-131337 | 5/1997 |
| JP | 2000-004400 | 1/2000 |

* cited by examiner

Primary Examiner—Constantine Hannaher
Assistant Examiner—Shun Lee
(74) Attorney, Agent, or Firm—Oblon, Spivak, McClelland, Maier & Neustadt, P.C.

(57) ABSTRACT

A radiation detector has a plurality of charge conversion elements which are laid out in a matrix and convert incoming radiation into charges, a plurality of capacitors for storing the charges generated by the charge conversion elements, and charge read elements for reading the charges stored in the capacitors. Signals other than signals originated to charges stored in the capacitors, which are produced upon, e.g., turning on/off the charge read elements are canceled by adjustment means, thus improving the S/N ratio.

30 Claims, 20 Drawing Sheets

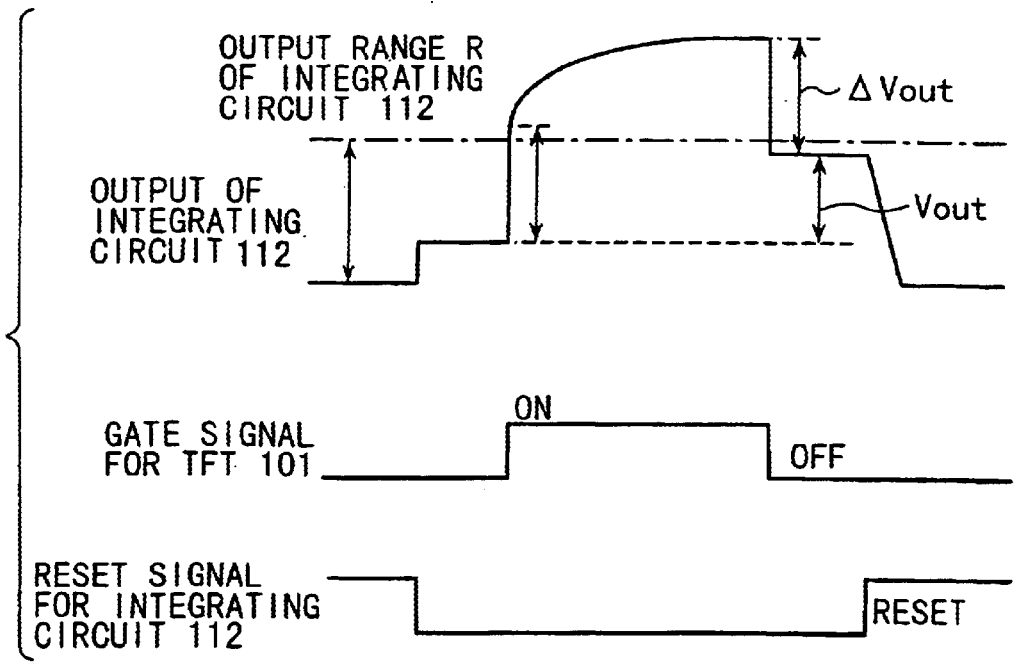
FIG. 2 PRIOR ART
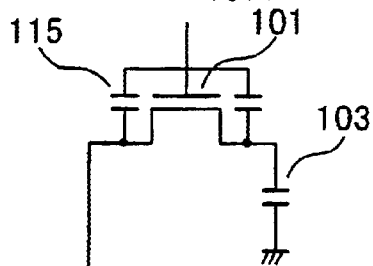
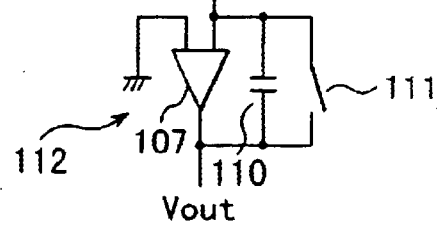
FIG. 3 PRIOR ART

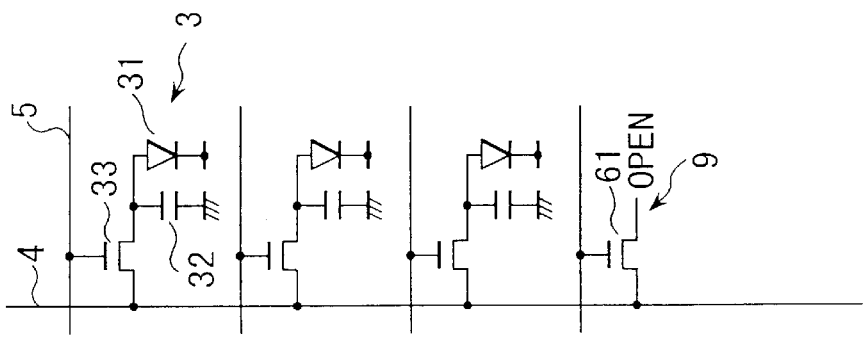
FIG. 20D OPEN TYPE
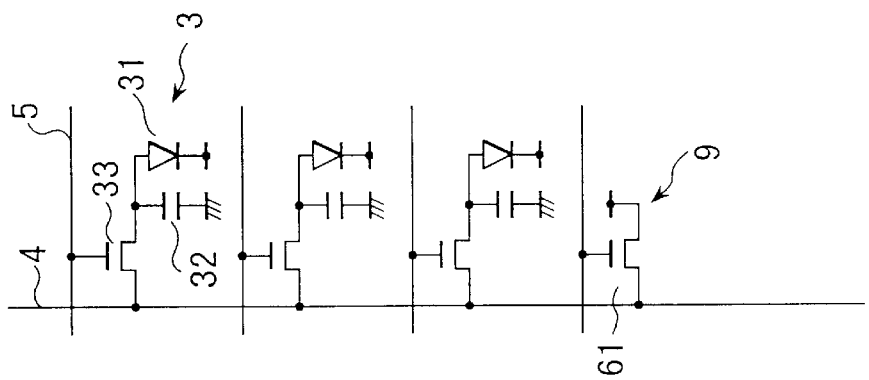
FIG. 20C CONSTANT-POTENTIAL TYPE
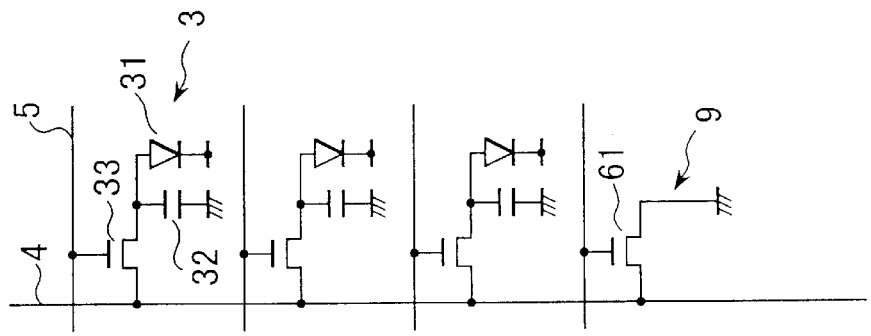
FIG. 20B GND TYPE
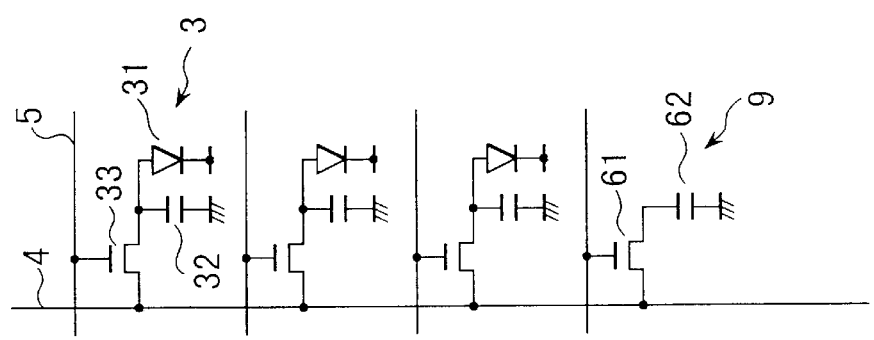
FIG. 20A CAPACITOR TYPE

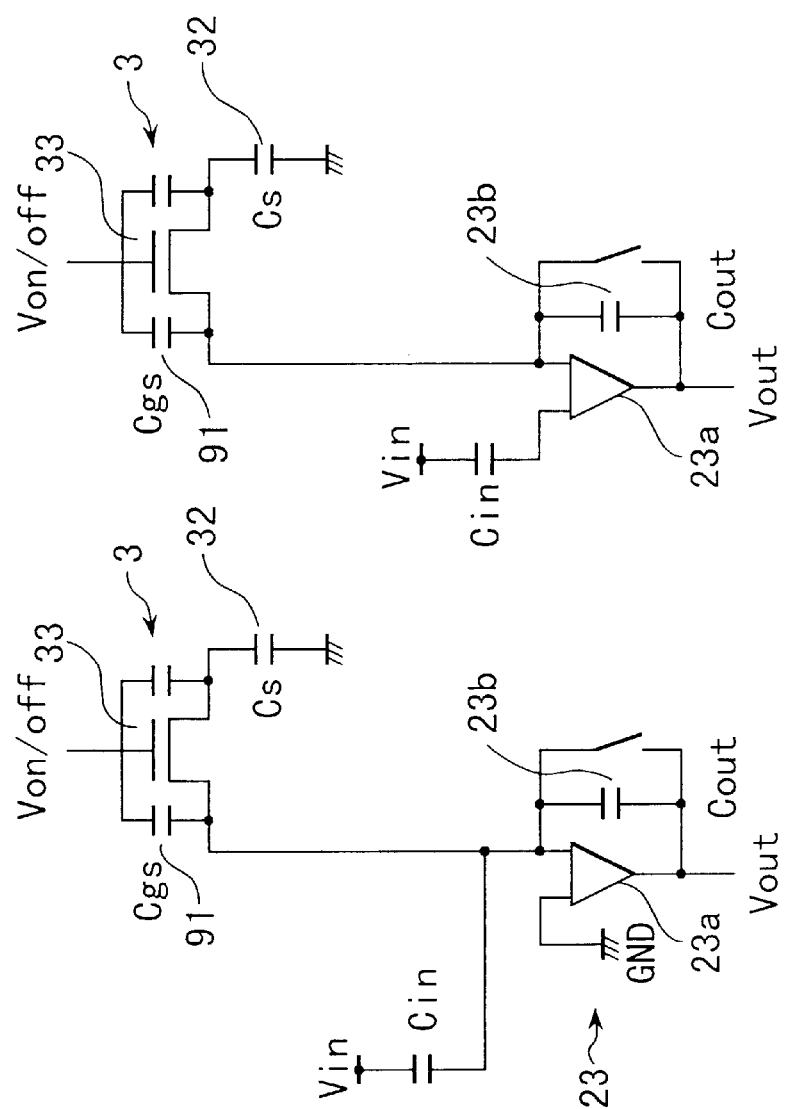

RADIATION DETECTOR

CROSS-REFERENCE TO RELATED APPLICATIONS

This application is based upon and claims the benefit of priority from the prior Japanese Patent Applications No. 11-160213, filed Jun. 7, 1999; and No. 2000-108099, filed Apr. 10, 2000, the entire contents of which are incorporated herein by reference.

BACKGROUND OF THE INVENTION

The present invention relates to a radiation detector using a thin-film transistor (TFT) as a read switching element.

A radiation detector that uses a TFT as a switching element for each pixel is formed by repeating processes for forming a thin film on one surface of a glass substrate, patterning the thin film by etching, forming another thin film to overlap the etched pattern, and patterning the latter thin film.

FIG. 1 shows the arrangement of a conventional radiation detector. The radiation detector has a plurality of pixels arrayed in a matrix. Each pixel 203 is constructed by a photoelectric conversion element 102 which can directly convert incoming radiation (e.g., X-rays) into a charge and is formed of selenium, a capacitor 103 for storing the generated charge, and a signal read TFT 101. A charge stored in the capacitor 103 of each pixel is read to an integrating circuit 112 including an amplifier 107, capacitor 110 and switching device 111, and multiplexer 109, via the TFT 101 and a signal line 105.

As shown in FIG. 2, a gate driver 108 turns on/off each TFT 101 by changing the potential on a vertical select line 106. Upon switching the TFT 101 between ON and OFF, an offset voltage $\Delta V_{out}$ is generated by the TFT 101. The offset voltage $\Delta V_{out}$ is given by:

$$\Delta V_{out} = (C_{gs}/C_{out}) \times (V_{on} - V_{off})$$

where $C_{gs}$ is the effective capacitance 115 between the gate of the TFT 101 and the signal line 105, $V_{on}$ is the ON voltage of the TFT 101, $V_{off}$ is the OFF voltage of the TFT 101, and $C_{out}$ is the capacitance of a capacitor 110 of an integrating circuit 112, as shown in FIG. 3.

More specifically, when $C_{out}$ is small, $\Delta V_{out}$ increases. Especially, when the radiation detector is used in X-ray fluoroscopy, the integrating circuit 112 uses a capacitor 110 having a small capacitance $C_{out}$ due to a weak detection signal, and the signal voltage must therefore be amplified. The offset voltage $\Delta V_{out}$ is also amplified considerably together with the signal voltage. The amplified offset voltage $\Delta V_{out}$ practically narrows down the dynamic range of the integrating circuit 112. Also, the amplified offset voltage $\Delta V_{out}$ saturates the integrating circuit 112. These factors cause an S/N ratio drop.

BRIEF SUMMARY OF THE INVENTION

It is an object of the present invention to improve the S/N ratio of a radiation detector.

The radiation detector comprises a plurality of charge conversion elements which are laid out in a matrix and convert incoming radiation into charges, a plurality of capacitors for storing the charges generated by the charge conversion elements, and charge read elements for reading the charges stored in the capacitors. Signals other than signals originated to charges stored in the capacitors, which are produced upon, e.g., turning on/off the charge read elements are canceled by adjustment means, thus improving the S/N ratio.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a timing chart for explaining the operation of the conventional detector;

FIG. 3 is an equivalent circuit diagram of a pixel of an integrating circuit of the conventional detector;

FIGS. 20A to 20D show variations of a dummy pixel shown in FIGS. 14 to 19;

FIGS. 28A to 28C show modifications of the integrating circuit in the first to 10th embodiment.

DETAILED DESCRIPTION OF THE INVENTION

The present invention will be described in detail hereinafter by way of its preferred embodiments.

First Embodiment

Figure 1:
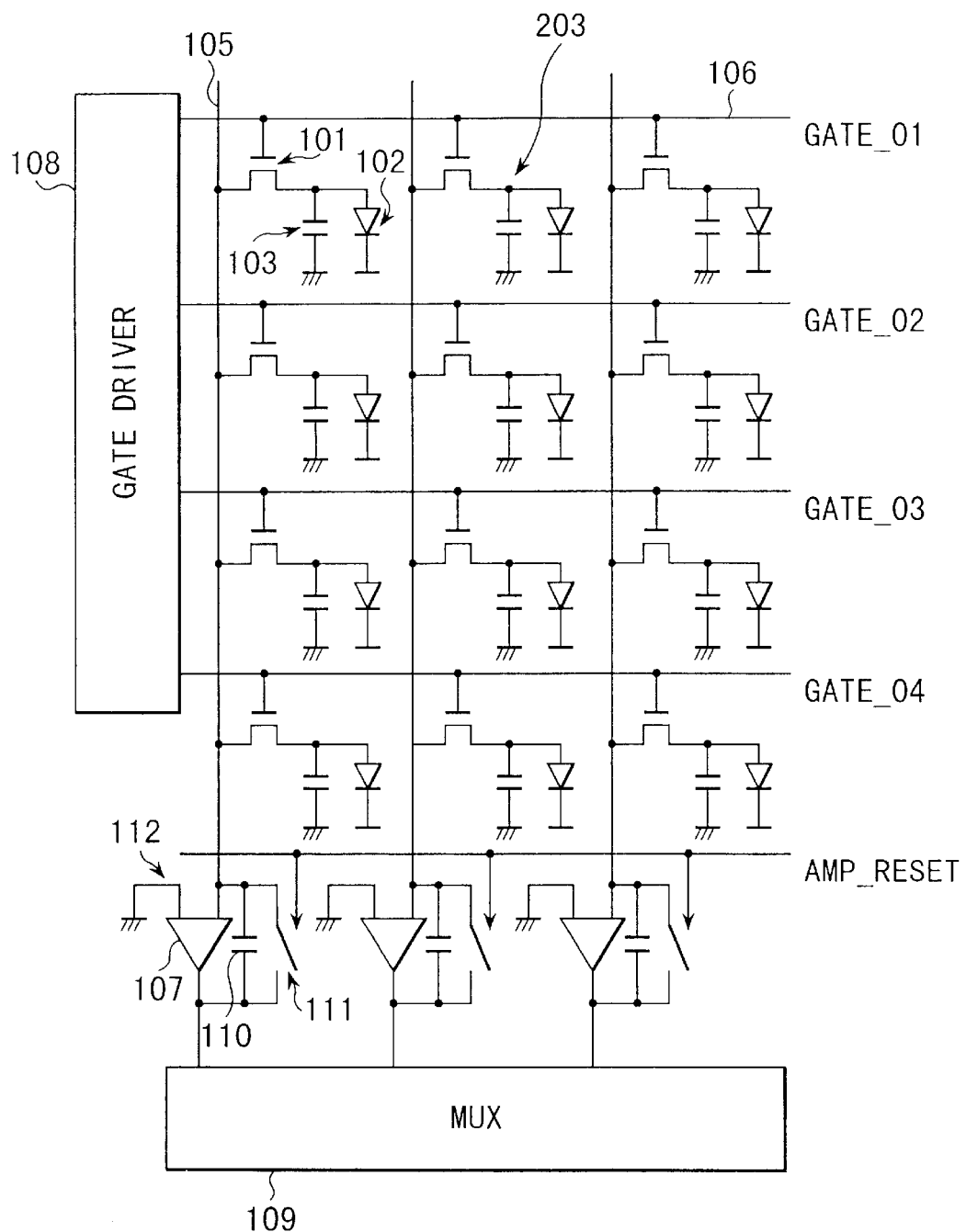
FIG. 1 is a circuit diagram showing the arrangement of a conventional radiation detector.
Figure 4:
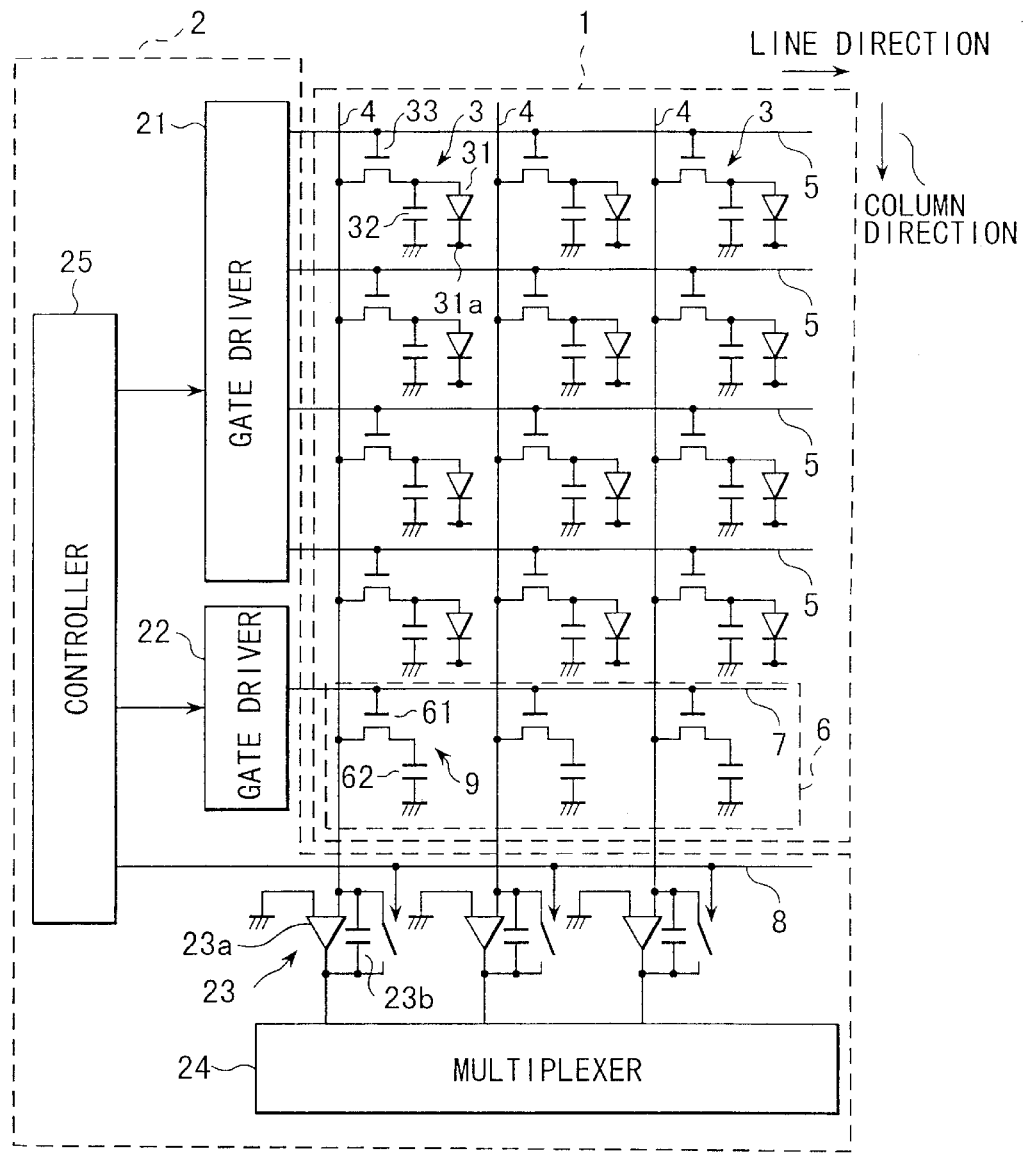
FIG. 4 is a circuit diagram showing the arrangement of a radiation detector according to the first embodiment of the present invention.

FIG. 4 is a circuit diagram showing the arrangement of a radiation detector according to the first embodiment of the present invention. As shown in FIG. 4, the radiation detector of the first embodiment comprises an X-ray detection section 1 for detecting incoming radiation, e.g., X-rays, and a read circuit section 2 for reading a signal corresponding to the X-ray intensity detected by the X-ray detection section 1.

The X-ray detection section 1 has a plurality of pixel 3 which are disposed in a two-dimensional matrix, signal lines 4 for reading signals from the pixels 3, vertical select lines 5 for selecting pixels 3 from which signals are to be read, an adjustment block 6 for adjusting signals output from the pixels 3 to reduce an offset in an integrating circuit (to be described later), and an adjustment block control line 7.

Each pixel 3 is constructed by a photoelectric conversion element 31 for converting incoming radiation into a charge in an amount corresponding to its intensity, a capacitor 32 for storing the charge generated by the photoelectric conversion element 31, and a thin-film transistor (to be referred to as a read TFT hereinafter) 33 for reading a signal.

As the photoelectric conversion element 31, selenium that directly converts X-rays into a charge is used. One terminal of the capacitor 32 is connected to ground. A terminal 31a of the photoelectric conversion element 31 is maintained at a predetermined potential.

The element 31 may be a type that indirectly converts X-rays into a charge. In this case, the element 31 has a scintillator converting X-rays into light and a photodiode converting the light into a charge.

The adjustment block 6 consists of a plurality of dummy pixels 9. The plurality of dummy pixels 9 are respectively connected to the plurality of signal lines 4. Each dummy pixel 9 is constructed by an adjustment thin-film transistor (to be referred to as an adjustment TFT hereinafter) 61 and capacitor 62. In each dummy pixel 9, unlike the pixel 3 no photoelectric conversion element is present or a photoelectric conversion element, if present, is not electrically connected to the adjustment TFT 61. For this reason, each dummy pixel 9 generates only an offset upon switching of the TFT without generating any signal charge. The plurality of adjustment TFTs 61 are commonly connected to the control line 7. The adjustment TFTs 61 are formed together with the read TFTs 33 by the same process as the read TFTs 33, and the capacitors 62 are formed together with the capacitors 32 for storing signal charges by the same process as the capacitors 32. As a result, the adjustment TFTs 61 have approximately the same characteristics as the read TFTs 33. Also, the capacitors 62 have approximately the same capacitance as the capacitors 32 for storing signal charges.

The read circuit section 2 has a gate driver 21 for selectively applying a voltage to the vertical select lines 5 to simultaneously turn on/off the plurality of read TFTs 33, a gate driver 22 for applying a voltage to the control lines 7 to simultaneously turn on/off the plurality of adjustment TFTs 61, integrating circuits 23 for integrating charges read via the read TFTs 33, a multiplexer 24 for sequentially selecting signals amplified by the integrating circuits 23, and a controller 25 for controlling the respective building components such as the gate drivers 21 and 22, multiplexer 24, and the like of the read circuit section 2. Each integrating circuit 23 has an amplifier 23a for amplifying a signal read via the read TFT 33, and an integrating capacitor 23b.

The controller 25 controls the gate driver 21 to selectively apply an ON voltage to the vertical select lines 5. Read TFTs 33 connected to a vertical select line 5 which is applied with the ON voltage are simultaneously turned on. When read TFTs 33 are ON, signal charges stored in corresponding capacitors 32 are read onto corresponding signal lines 4. The controller 25 controls the gate driver 21 to selectively apply an OFF voltage to the vertical select lines 5. Read TFTs 33 connected to a vertical select line 5 which is applied with the OFF voltage are simultaneously turned off. When read TFTs 33 are turned off, the read of signal charges from the capacitors 32 stops.

Figure 5:
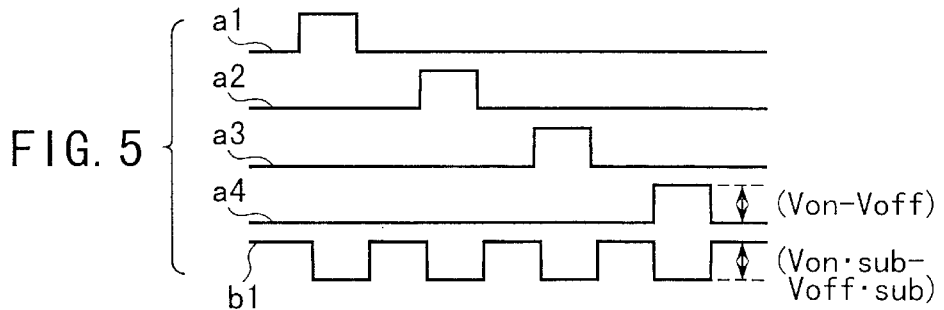
FIG. 5 is a timing chart for explaining the operation of the first embodiment.

As shown in FIG. 5, the controller 25 controls the gate driver 22 so that the adjustment TFTs 61 are turned on/off 180° out of phase with the read TFTs 33. That is, when the ON voltage is applied to a given vertical select line 5, the OFF voltage is applied to the control line 7 in synchronism with that ON voltage; when the OFF voltage is applied to a given vertical select line 5, the ON voltage is applied to the control line 7 in synchronism with that OFF voltage.

The controller 25 supplies a reset signal to a reset control line 8 during a period other than a period including the OFF period of the adjustment TFTs 61, thus resetting the integrating circuits 23.

The operation of the radiation detector will be described below.

As shown in FIG. 5, the gate driver 21 switches the voltages of control signals a1, a2, a3, a4, . . . respectively corresponding to the plurality of vertical select line 5 to an ON voltage in turn. With this control, the read TFTs 33 are sequentially turned on in units of lines. On the other hand, the gate driver 22 switches the voltage of a control signal b1 of the control line 7 to an OFF voltage in synchronism with the voltage switching timings of the control signals a1, a2, a3, a4, . . . Note that the amplitude of the control signal b1 is set to be substantially equivalent to that of the control signal a1 (a2, a3, a4).

Figure 6:
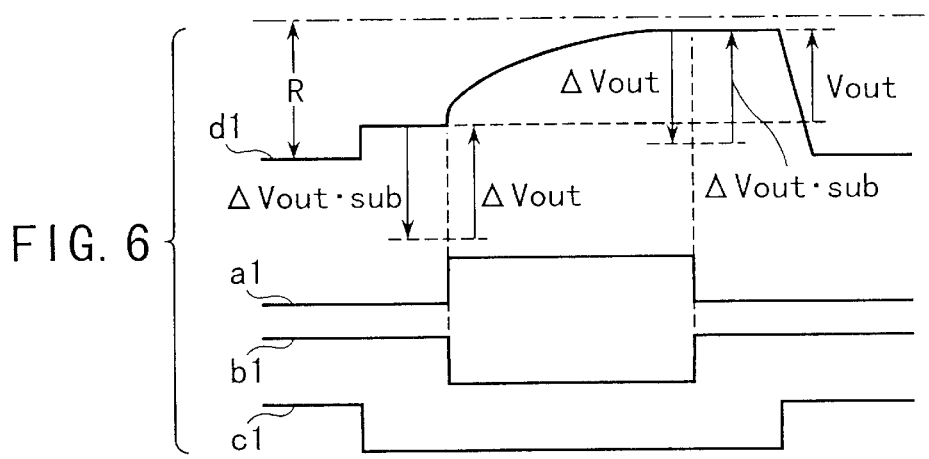
FIG. 6 is a timing chart showing the output signal of an integrating circuit shown in FIG. 4.

As shown in FIG. 6, the gate driver 22 applies an OFF voltage to the adjustment block control line 7 connected to the gates of the adjustment TFTs 61 to turn them off under the control of the controller 25.

At substantially the same time, the gate driver 21 applies an ON voltage to the first vertical select line 5 to turn on the read TFTs 33 of the pixels 3 connected to that vertical select line 5. As a result, charges stored in the capacitors 32 of the individual pixels 3 are supplied onto the signal lines 4 via the read TFTs 33, and are read by the integrating circuits 23.

After an elapse of a predetermined read time, the gate driver 21 switches, e.g., the control signal a1 to an OFF voltage and, at substantially the same time, the gate driver 22 applies an ON voltage as the control signal b1 to turn on the adjustment TFTs 61.

The controller 25 supplies a reset signal c1 to the reset control line 8 to reset the integrating circuits 23 during periods before and after the predetermined read time.

Figure 7:
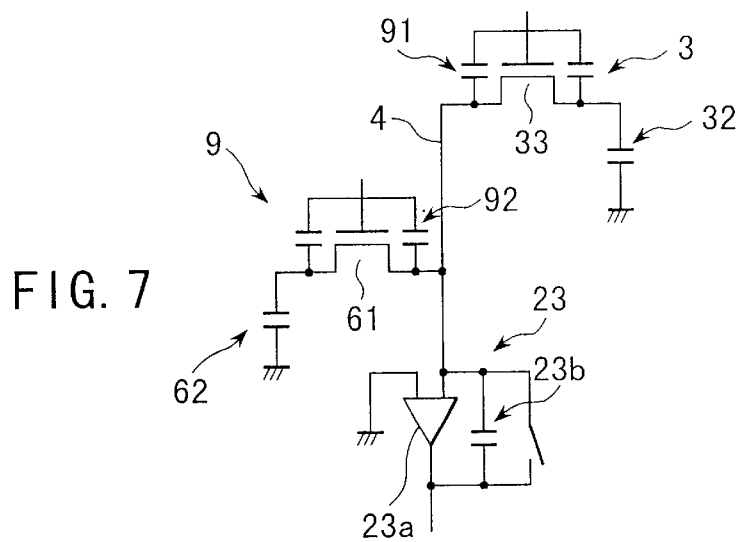
FIG. 7 is an equivalent circuit diagram of a pixel, dummy pixel, and integrating circuit shown in FIG. 4.

On the other hand, capacitances expressed by capacitors 91 and 92 as an electrically equivalent circuit are respectively formed between the gate of each read TFT 33 and the signal line 4, and between the gate of each adjustment TFT 61 and the signal line 4, as shown in FIG. 7.

When capacitances Cgs and Cgs·sub of these capacitors 91 and 92 are equal to each other, a gate ON voltage Von and gate OFF voltage Voff applied to the gate of each read TFT 33 become equal to a gate ON voltage Von·sub and gate OFF voltage Voff·sub applied to the gate of each adjustment TFT 61. That is, the gate ON voltage Von and gate OFF voltage Voff are respectively given by:

$$Von=Von\cdot sub \quad (2)$$

$$Voff=Voff\cdot sub \quad (3)$$

Alternatively, these sets of gate ON and OFF voltages may have equal differences. In this case, we have:

$$Von-Voff=Von\cdot sub-Voff\cdot sub \quad (4)$$

As shown in FIG. 6, an output waveform d1 from each integrating amplifier 23a drops by an offset ΔVout·sub across the adjustment TFT 61, since the adjustment TFT 61 is disconnected from the signal line 4 when the control signal b1 changes from ON to OFF.

Immediately after this, when, for example, the control signal a1 changes from ON to OFF, each read TFT 33 is connected to the signal line 4, and the output waveform d1 rises by an offset ΔVout across that read TFT 33, which is substantially equal to the offset ΔVout·sub, and further rises by a detection signal Vout in accordance with a predetermined time constant.

In this case, the offset ΔVout is determined by the capacitance Cgs of the capacitor 91 shown in FIG. 7, the gate voltage difference (Von−Voff), and a capacitance Cout of the integrating capacitor 23b of the integrating circuit 23, and is given by:

$$\Delta Vout=Cgs\ (Von-Voff)/Cout \quad (5)$$

When a charge is read by each integrating circuit 23, the control signal a1 is switched to an OFF voltage, the read TFT 33 is disconnected from the signal line 4, and the output waveform d1 drops by the offset ΔVout accordingly.

Immediately after this, when the control signal b1 changes from OFF to ON, each adjustment TFT 61 is connected to the signal line 4, the output waveform d1 rises by the offset ΔVout·sub, and the controller 25 then supplies a reset signal c1 to the reset control line 8 to reset the output waveform d1 to zero level.

Note that the offset ΔVout·sub in the adjustment TFT 61 is determined by the capacitance Cgs·sub of the capacitor 92 shown in FIG. 7, the gate voltage difference (Von·sub−Voff·sub), and the capacitance Cout of the integrating capacitor 23b of the integrating circuit 23, and is given by:

$$\Delta Vout\cdot sub=Cgs\cdot sub\ (Von\cdot sub-Voff\cdot sub)/Cout \quad (6)$$

The aforementioned operations are sequentially repeated for the read TFTs 33 connected to the second and subsequent lines to read a single image.

That is, each read TFT is driven to be turned on once during a vertical scan period, while the adjustment TFT is driven to be turned on once during a horizontal scan period.

As described above, according to the first embodiment, since the adjustment TFTs 61 and the read TFTs 33 of the respective pixels operate 180° out of phase with each other, their offset voltage cancel each other. As a result, an offset voltage produced upon switching can be practically reduced. Therefore, upon detecting a weak signal in, e.g., fluoroscopy, since a signal can be sufficiently amplified without wasting the dynamic range of each integrating circuit 23, the S/N ratio also improves. In addition, since the conventional manufacturing technique can be used in array design, the detector can be easily manufactured without adding any new processes.

Second Embodiment

Figure 8:
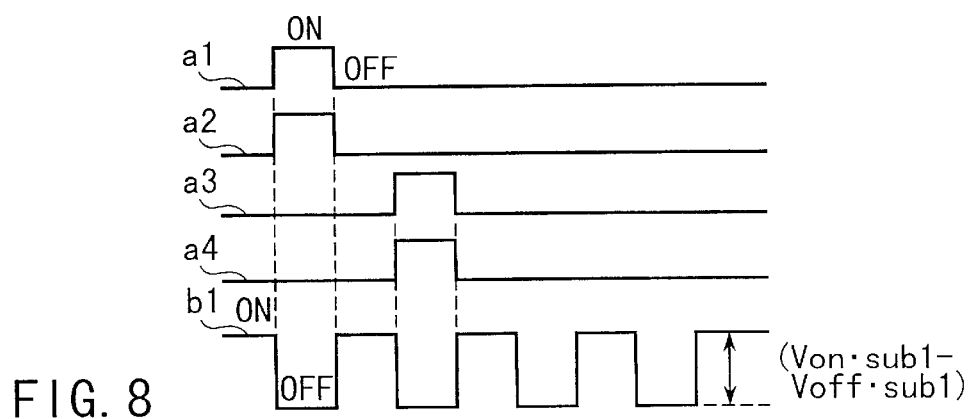
FIG. 8 is a timing chart for explaining the operation according to the second embodiment of the present invention.

FIG. 8 is a timing chart for explaining the operation of a radiation detector according to the second embodiment. The second embodiment is different from the aforementioned first embodiment in that two vertical select lines 5 are simultaneously turned on to simultaneously read signal charges from a pair of neighboring pixels 3 in the column direction.

In the second embodiment, since two vertical select lines 5 are simultaneously turned on, the difference between a gate ON voltage Von·sub1 and gate OFF voltage Voff·sub1 applied to the gate of each adjustment TFT 33 is set to be twice that between the gate ON voltage Von·sub and gate OFF voltage Voff·sub used in the first embodiment, as shown in FIG. 8. That is, the difference between the gate ON voltage Von·sub1 and gate OFF voltage Voff·sub1 is:

$$\Delta Von\cdot sub1-Voff\cdot sub1=2\ (Von\cdot sub-Voff\cdot sub) \quad (7)$$

As described above, according to the second embodiment, substantially the same effect as in the first embodiment described above can be obtained. In addition, a horizontal scan can be done faster.

Third Embodiment

Figure 9:
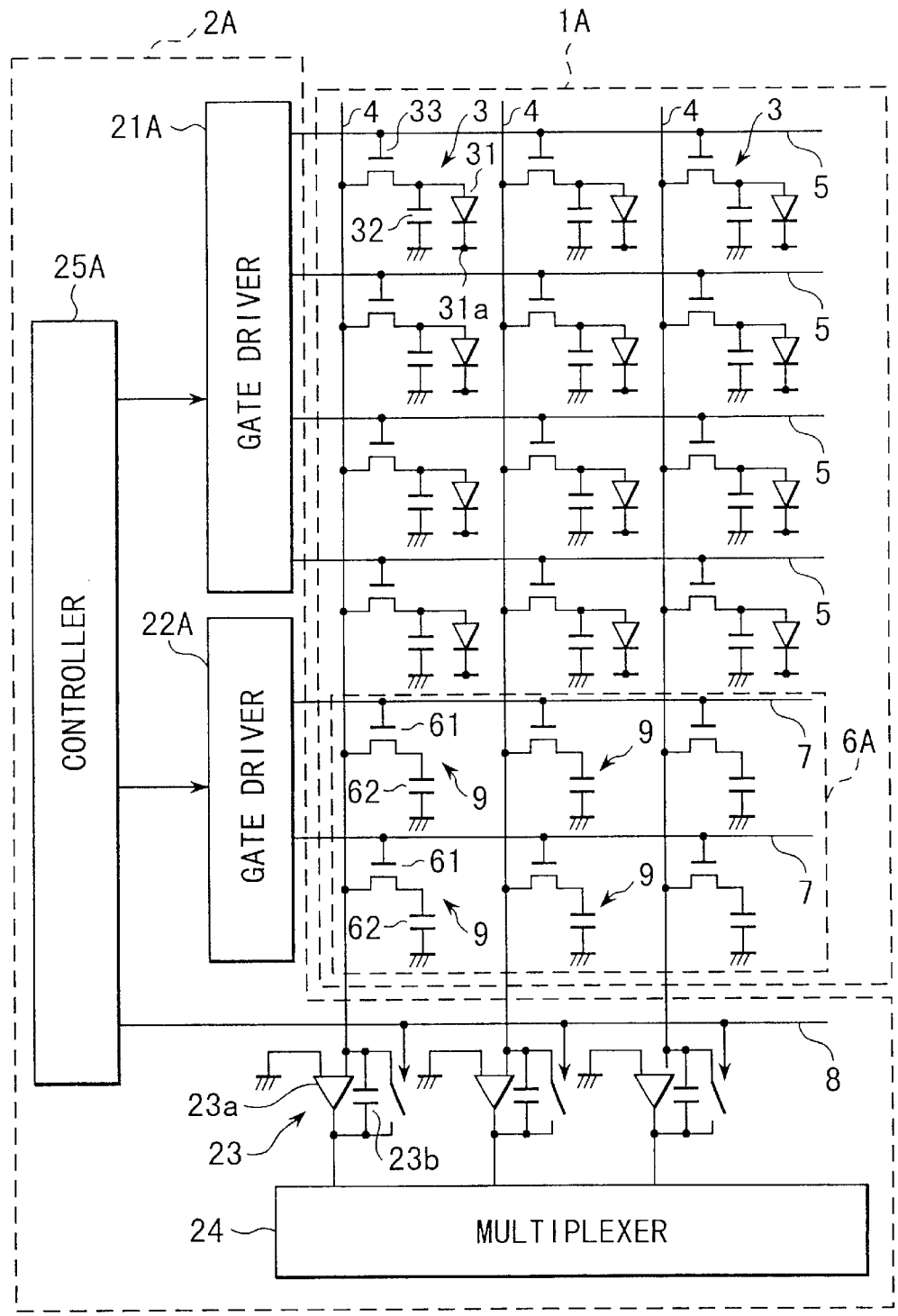
FIG. 9 is a circuit diagram showing the arrangement of a radiation detector according to the third embodiment of the present invention.
Figure 10:
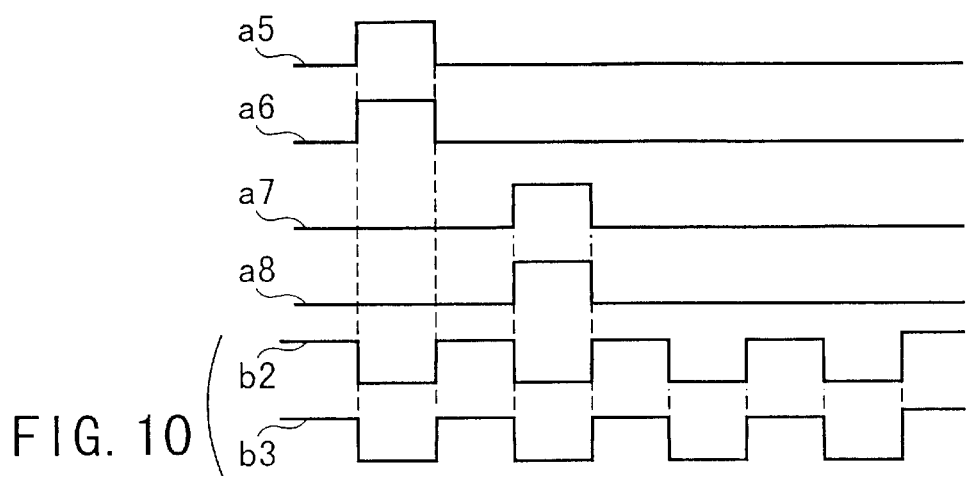
FIG. 10 is a timing chart for explaining the operation of the third embodiment.

FIG. 9 is a circuit diagram of a radiation detector according to the third embodiment of the present invention, and FIG. 10 is a timing chart for explaining the operation of the radiation detector shown in FIG. 9.

Unlike the first embodiment, a characteristic feature of the third embodiment lies in that two dummy pixels 9 are connected to each of a plurality of signal lines 4.

As shown in FIG. 9, the radiation detector of the third embodiment comprises an X-ray detection section 1A and read circuit section 2A. The X-ray detection section 1A has a plurality of pixels 3, a plurality of signal lines 4, a plurality of vertical select lines 5, adjustment block 6A, and adjustment block control lines 7 for controlling the adjustment block 6A.

Each pixel 3 has a photoelectric conversion element 31, capacitor 32, and read TFT 33.

The adjustment block 6A has a plurality of dummy pixels 9. Two dummy pixels 9 are connected to each signal line 4. More specifically, two lines of adjustment TFTs 61 are connected parallel to each other, and the adjustment block control lines 7 are connected to the adjustment TFTs 61 of these lines.

The read circuit section 2A has a gate driver 21A, gate driver 22A, integrating circuits 23 each having an integrating amplifier 23a and integrating capacitor 23b, multiplexer 24, and controller 25A.

The operation of this radiation detector will be explained below.

As shown in FIG. 10, the gate driver 21A supplies control signals a5 (a6, a7, a8) to the read TFTs 33 connected to the first to fourth lines via the vertical select lines 5 to sequentially turn them on/off, and the gate driver 22A supplies control signals b2 (b3) to the adjustment TFTs 61 connected to the respective lines via the adjustment block control lines 7 to turn on/off the adjustment TFTs 61 in correspondence with the ON/OFF states of the read TFTs 33.

Under the control of the controller 25A, the gate driver 22A sets OFF voltages as the control signals b2 and b3 to be sent on the two adjustment block control lines 7, and at substantially the same time, the gate driver 21A sets ON voltages as the control signals a5 and a6 to be sent on two, e.g., first and second, vertical select lines 5.

After an elapse of a predetermined read time, the gate driver 21A switches the control signals a5 and a6 to OFF voltages, the gate driver 22A switches the control signals b2 and b3 to ON voltage at substantially the same time, and the controller 25A resets the integrating circuits 23.

As a result, charges stored in the capacitors 32 in the pixels with ON read TFTs 33 are supplied onto the signal lines 4 via the read TFTs 33, and are read by the integrating circuits 23.

During the next horizontal scan period, the gate driver 22A switches the control signals b2 and b3 to OFF voltages again, and the gate driver 21A switches the control signals a7 and a8 to be sent on two, i.e., third and fourth, vertical select lines 5 to ON voltages, thereby reading signals of these lines. By repeating the aforementioned operations, one image is read.

In the third embodiment, as in the first embodiment described above, when the capacitances Cgs and Cgs·sub of the capacitors 91 and 92 are equal to each other, the gate ON voltage Von and gate OFF voltage Voff to be applied to the gate of each read TFT 33 respectively become equal to the gate ON voltage Von·sub and gate OFF voltage Voff·sub to be applied to the gate of each adjustment TFT 61. Or these sets of gate ON and OFF voltages have equal differences.

As described above, according to the third embodiment, substantially the same effect as in the first embodiment described above can be obtained. Also, since signals are simultaneously read from two lines, a faster scan can be achieved.

Fourth Embodiment

Figure 11:
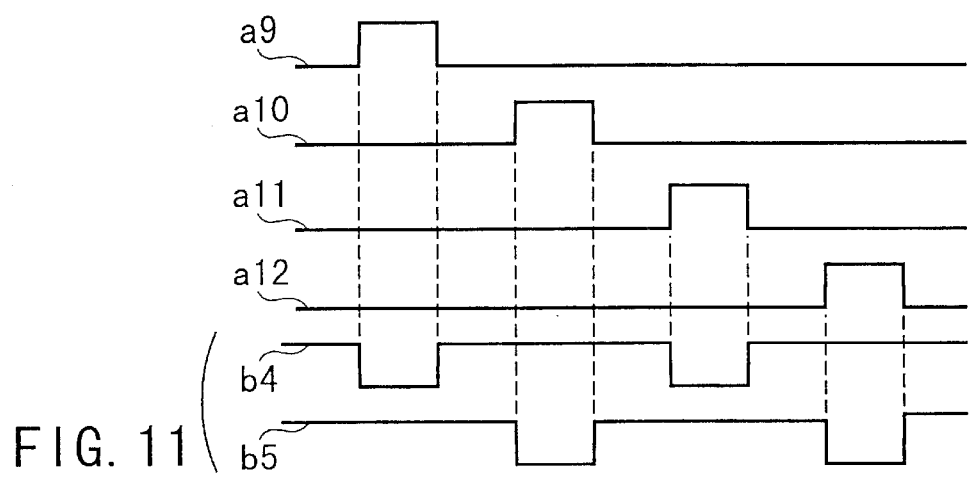
FIG. 11 is a timing chart for explaining the operation according to the fourth embodiment of the present invention.

FIG. 11 is a timing chart for explaining the operation of a radiation detector according to the fourth embodiment of the present invention. The fourth embodiment is different from the third embodiment mentioned above in that a vertical select line to be driven is selected one by one.

Since other arrangements are substantially the same as those of the third embodiment, a detailed description thereof will be omitted.

The operation of this flat X-ray solid-state detector will be described below.

As shown in FIG. 11, the gate driver 21A supplies control signals a9 (a10, a11, a12) to the read TFTs 33 connected to the first to fourth lines via corresponding vertical select lines 5 to sequentially turn them on/off, and the gate driver 22A supplies control signals b4 (b5) to the adjustment TFTs 61 of the respective lines via the adjustment block control lines 7 to turn on/off the adjustment TFTs 61 in correspondence with the ON/OFF states of the read TFTs 33.

Under the control of the controller 25A, the gate driver 22A sets an OFF voltage as the control signal b4 to be sent on the first adjustment block control line 7 and, at substantially the same time, the gate driver 21A sets an ON voltage as the control signal a9 to be sent on, e.g., the first vertical select line 5.

After an elapse of a predetermined read time, the gate driver 21A switches the control signal a9 to an OFF voltage, the gate driver 22A switches the control signal b4 to an ON voltage at substantially the same time, and the controller 25A resets the integrating circuits 23.

As a result, charges stored in the capacitors 32 in the pixels with ON read TFTs 33 are supplied onto the signal lines 4 via the read TFTs 33, and are read by the integrating circuits 23. Note that the control signal b5 is maintained as an ON voltage during this period.

During the next horizontal scan period, the gate driver 22 maintains the control signal b4 as an OFF voltage and switches the control signal b5 to an OFF voltage in turn and, at substantially the same time, the gate driver 21A switches the control signal a10 to be sent on the second vertical select line 5 to an ON voltage, thus reading signals of this line.

After that, the control signal b4 is switched to an OFF voltage and the control signal a11 to be sent on the third vertical select line 5 are switched to an ON voltage to read charges from the pixels of that line. Also, the control signal b5 is switched to an OFF voltage and the control signal a12 to be sent on the fourth vertical select line 5 are switched to an ON voltage to read charges from the pixels of that line.

In this manner, the gate driver 22A alternately switches the control signals b4 and b5 to OFF voltages in correspondence with the charge read timings from the pixels of the individual lines. By repeating the aforementioned operations, one image is read.

When a single adjustment TFT 61 is driven, the time required between the ON and OFF timings of the adjustment TFT 61 is several μsec, while the driving method of the fourth embodiment shown in FIG. 11 requires several ten μsec.

As described above, according to the fourth embodiment, substantially the same effect as in the first embodiment described above can be obtained. In addition, since a sufficiently long time can be assured between the ON and OFF timings of the adjustment TFTs 61 connected to one line, more stable operation can be assured.

Fifth Embodiment

Figure 12:
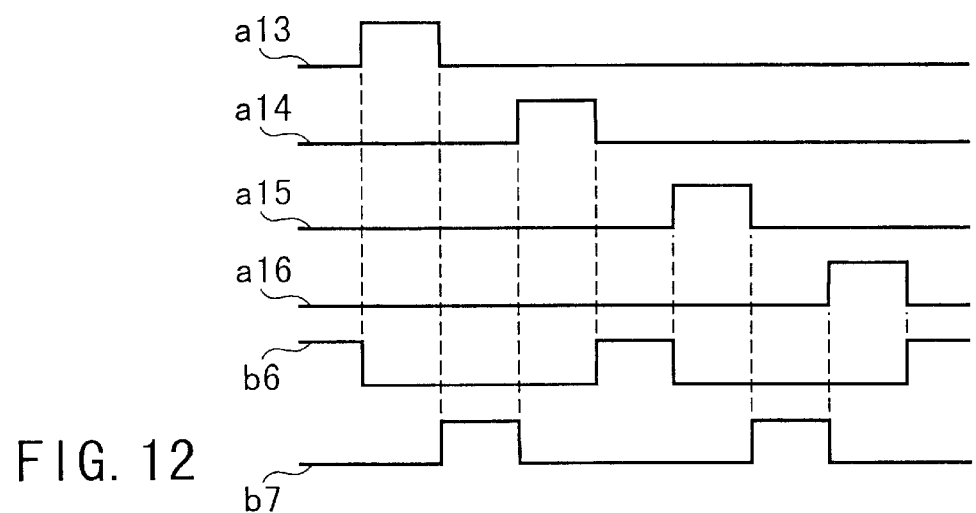
FIG. 12 is a timing chart for explaining the operation according to the fifth embodiment of the present invention.

FIG. 12 is a timing chart for explaining the operation of a radiation detector according to the fifth embodiment of the present invention. The fifth embodiment is different from the aforementioned fourth embodiment in that the OFF period of the adjustment TFTs 61 of one line is set to include the read time of the read TFTs 33 for two lines, and the adjustment TFTs 61 of the two lines are alternately turned on/off. Since other arrangements are the same as those in the fourth embodiment, a detailed description thereof will be omitted.

The operation of this radiation detector will be explained below. As shown in FIG. 12, the gate driver 21A supplies control signals a13 (a14, a15, a16) to the read TFTs 33 connected to the first to fourth lines via corresponding vertical select lines 5 to sequentially turn them on/off, and the gate driver 22A supplies control signals b6 (b7) to the adjustment TFTs 61 of the respective lines via the adjustment block control lines 7 to turn on/off the adjustment TFTs 61 in correspondence with the ON/OFF states of the read TFTs 33.

Under the control of the controller 25A, the gate driver 22A sets an OFF voltage as the control signal b6 to be sent on the first adjustment block control line 7 and, at substantially the same time, the gate driver 21A sets an ON voltage as the control signal a13 to be sent on, e.g., the first vertical select line 5.

After an elapse of a predetermined read time, the gate driver 21A switches the control signal a13 to an OFF voltage, the gate driver 22A maintains the control signal b6 to be the OFF voltage and switches the control signal b7 to an ON voltage at substantially the same time, and the controller 25A resets the integrating circuits 23.

As a consequence, charges stored in the capacitors 32 in the pixels with ON read TFTs 33 are supplied onto the signal lines 4 via the read TFTs 33, and are read by the integrating circuits 23.

During the next horizontal scan period, the gate driver 22A maintains the control signal b6 to be the OFF voltage and switches the control signal b7 to an OFF voltage and, at substantially the same time, the gate driver 21A switches the control signal a14 to be sent on the second vertical select line 5 to an ON voltage, thus reading signals of this line.

Next, the gate driver 22A maintains the control signal b7 to be the OFF voltage and switches the control signal b6 to an OFF voltage and, at substantially the same time, the gate driver 21A switches the control signal a15 to be sent on the third vertical select line 5 to an ON voltage, thus reading signals of this line.

After that, the gate driver 22A maintains the control signal b6 to be the OFF voltage and switches the control signal b7 to an OFF voltage and, at substantially the same time, the gate driver 21A switches the control signal a16 to be sent on the fourth vertical select line 5 to an ON voltage, thus reading signals of this line.

In this way, the gate driver 22A alternately sets OFF voltages as the control signals b6 and b7 in correspondence with the charge read timings of the pixels connected to the respective lines. By repeating the aforementioned operations, one image is read.

As described above, according to the fifth embodiment, substantially the same effect as in the fourth embodiment described above can be obtained.

The embodiments of the present invention have been explained in detail, but examples of the arrangement are not limited to those embodiments. For example, in the above embodiments, selenium is used as each photoelectric conversion element, but a combination of scintillator and a photodiode may be used.

In the first embodiment, the capacitances Cgs and Cgs·sub of the capacitors 91 and 92 are equal to each other. When the capacitances Cgs and Cgs·sub are different, the gate ON voltage Von·sub and gate OFF voltage Voff·sub are determined to satisfy:

$$Cgs\ (Von-Voff) = Cgs\cdot sub\ (Von\cdot sub - Voff\cdot sub) \quad (8)$$

Figure 13:
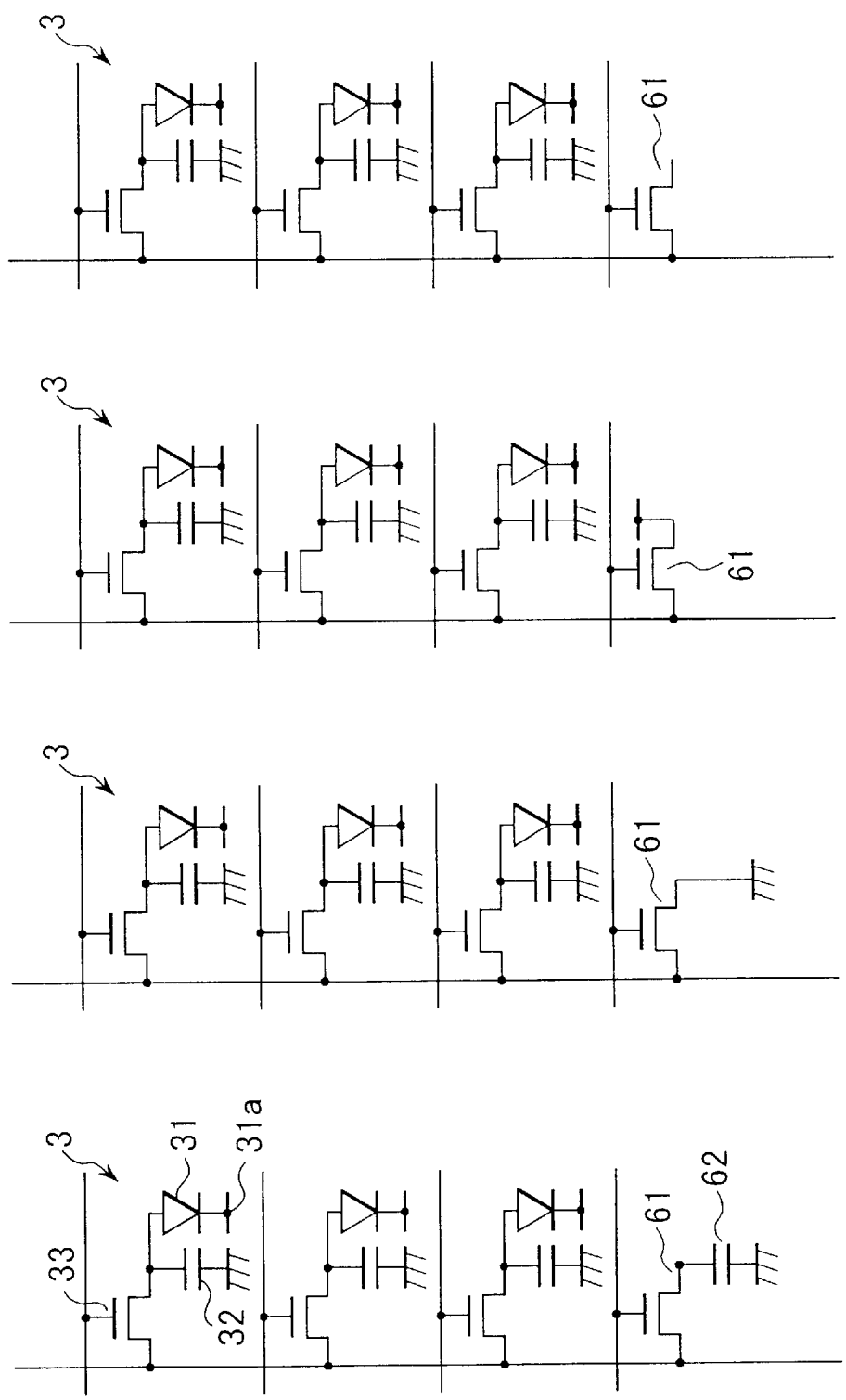
FIGS. 13A to 13D show variations of the dummy pixel shown in FIG. 4.

In the first embodiment, a capacitor 62 is connected to each adjustment TFT 61, as shown in FIGS. 4 and 13A. Alternatively, as shown in FIG. 13B, one terminal of the adjustment TFT 61 may be connected to ground. As shown in FIG. 13C, one terminal of the adjustment TFT 61 may be maintained at a constant potential. Furthermore, as shown in FIG. 13D, one terminal of the adjustment TFT 61 may be open.

When one terminal of the adjustment TFT 61 is connected to ground, as shown in FIG. 13B, since charge input/output occurs if a potential difference is present in the source-to-drain path of the adjustment TFT 61 due to some cause, precaution against generation of noise must be exercised. When one terminal of the adjustment TFT 61 is connected to a constant potential, as shown in FIG. 13C, precaution against generation of leakage current due to a potential difference in the source-to-drain path of the adjustment TFT 61 must be exercised. Furthermore, when one terminal of the adjustment TFT 61 is open, as shown in FIG. 13D, precaution against any potential difference in the source-to-drain path of the adjustment TFT, which is produced due to the influence of Cgs on the non-connected side must be exercised.

In the second embodiment, the detector is driven to simultaneously turn on two vertical select lines 5 to read two pixels at the same time. Alternatively, three or more (n) vertical select lines 5 may be turned on at the same time to read n pixels simultaneously.

In general, when n vertical select lines 5 are simultaneously turned on to read n pixels at the same time, a difference Von·sub2−Voff·sub2 between a gate ON voltage Von·sub2 and gate OFF voltage Voff·sub2 is:

$$\Delta Von\cdot sub2 - Voff\cdot sub2 = n\ (Von\cdot sub - Voff\cdot sub) \quad (9)$$

In the third embodiment, the detector is driven to simultaneously turn on two vertical select lines to read two pixels at the same time. Alternatively, the detector may be driven to simultaneously turn on n vertical select lines. In this case, voltages are applied so that the difference between the gate ON and OFF voltages applied to the gate of each adjustment TFT becomes n times.

In the third embodiment, when the capacitances Cgs and Cgs·sub of the capacitors 91 and 92 are different, the influence of offset voltages produced upon switching of the read TFTs 32 is minimized by adjusting the gate ON voltage Von and gate OFF voltage Voff to be supplied to the gate of each adjustment TFT 61.

In the fourth embodiment, the adjustment TFTs of two lines are alternately turned on/off to select the vertical select lines one by one. Alternatively, of the adjustment TFTs of the two lines, the adjustment block control line 7 connected to the gates of the adjustment TFTs connected to one line may be kept OFF, and the adjustment TFTs of the other line may be driven in the same manner as in the first embodiment, thereby selecting the vertical select lines one by one.

In the fourth embodiment, a terminal of each adjustment TFT 61, which is opposite to the signal line 4, is connected to the capacitor, but may be open (see FIG. 13D).

In the fifth embodiment, the adjustment TFT 61 may be connected to ground or a constant potential, or may be open without connecting anything), in place of the capacitor as in the first embodiment (see FIGS. 13A to 13D).

Sixth Embodiment

Figure 14:
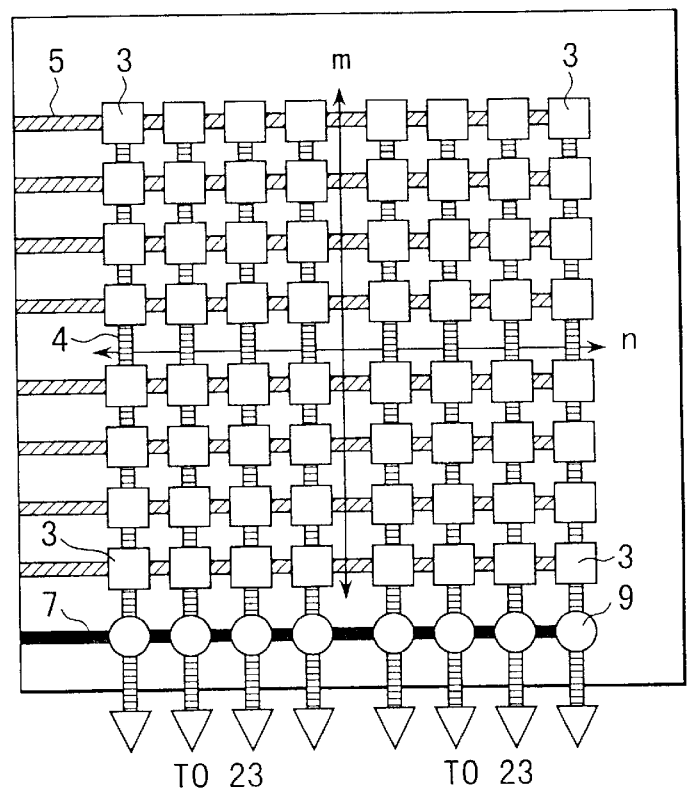
FIG. 14 is a schematic plan view of a pixel array of the first to fifth embodiments.
Figure 15:
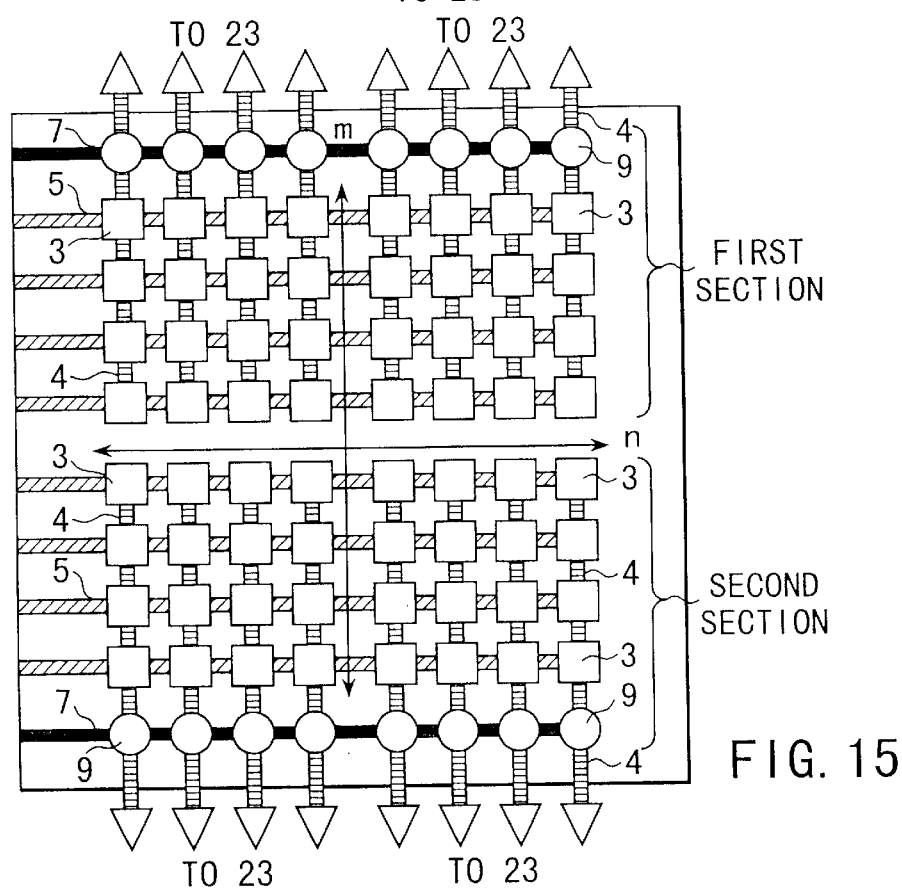
FIGS. 15 to 19 show variations of a pixel array section according to the sixth embodiment of the present invention.
Figure 16:
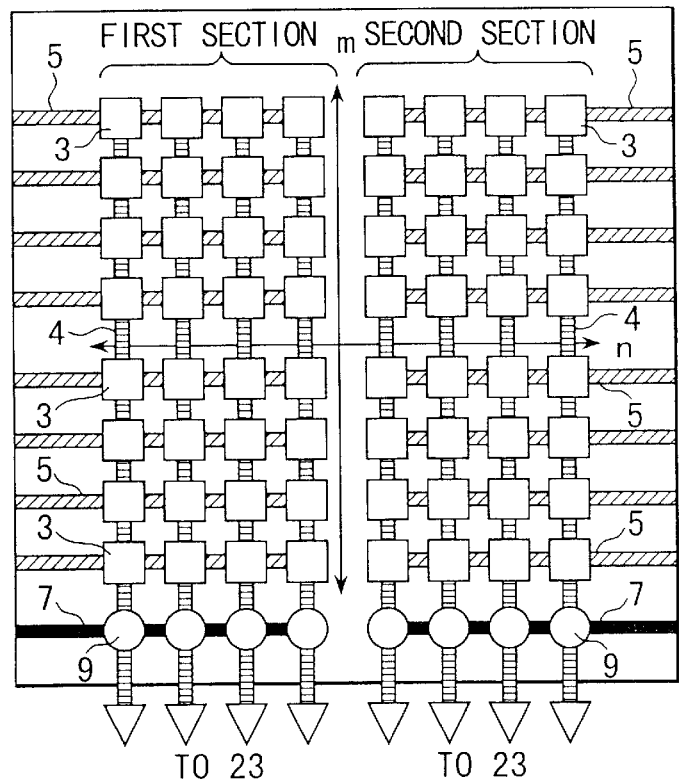
Figure 17:
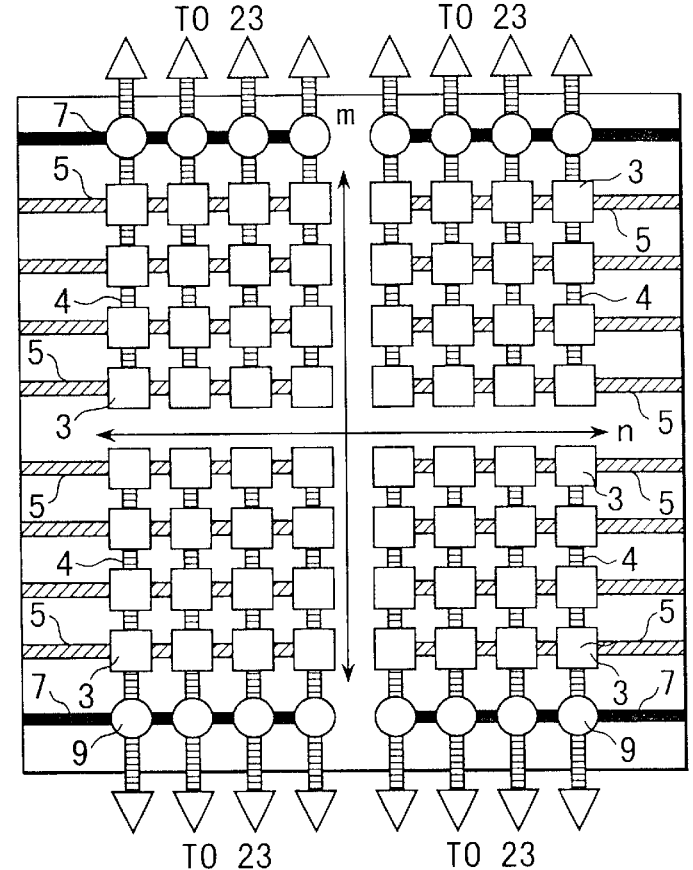
Figure 18:
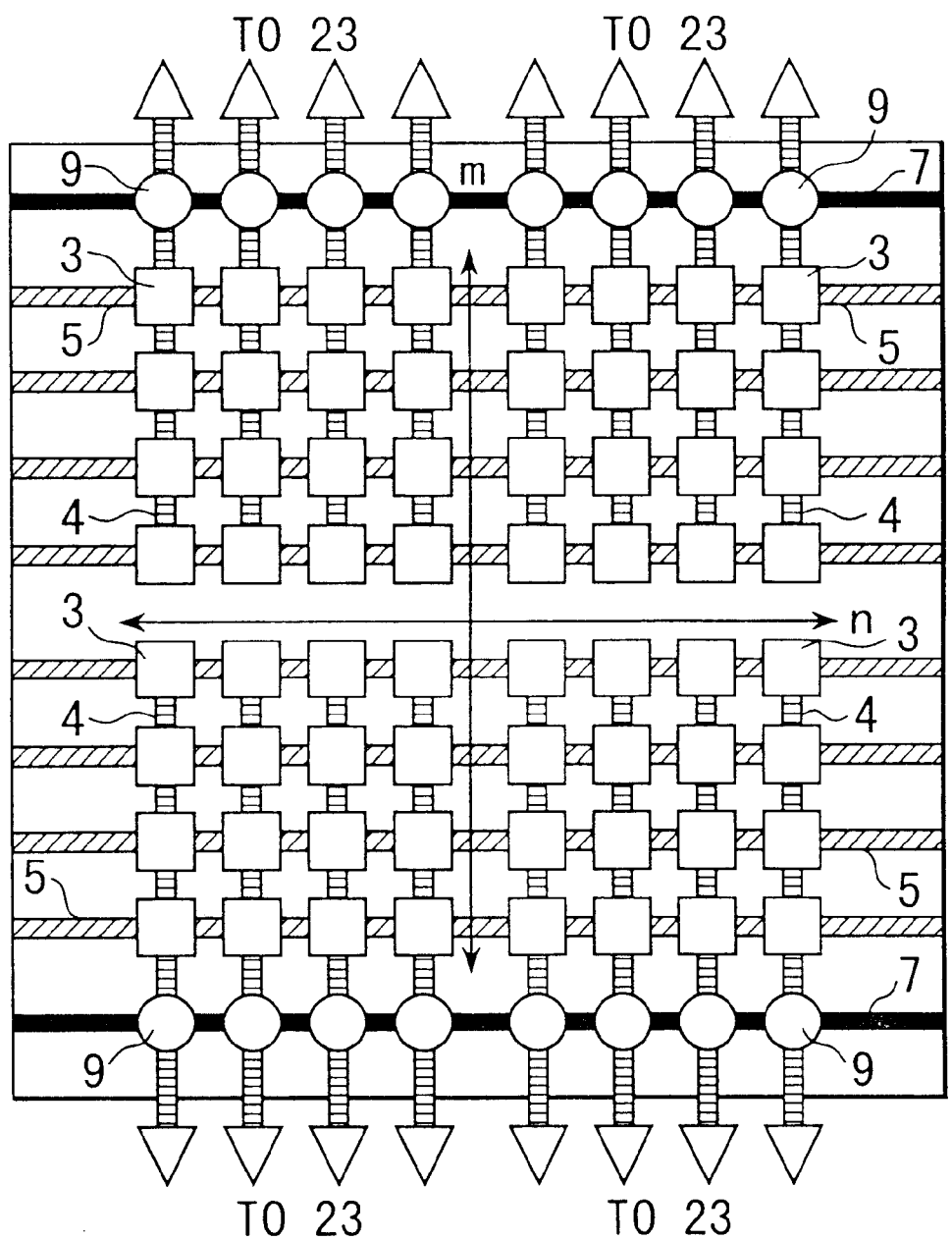
Figure 19:
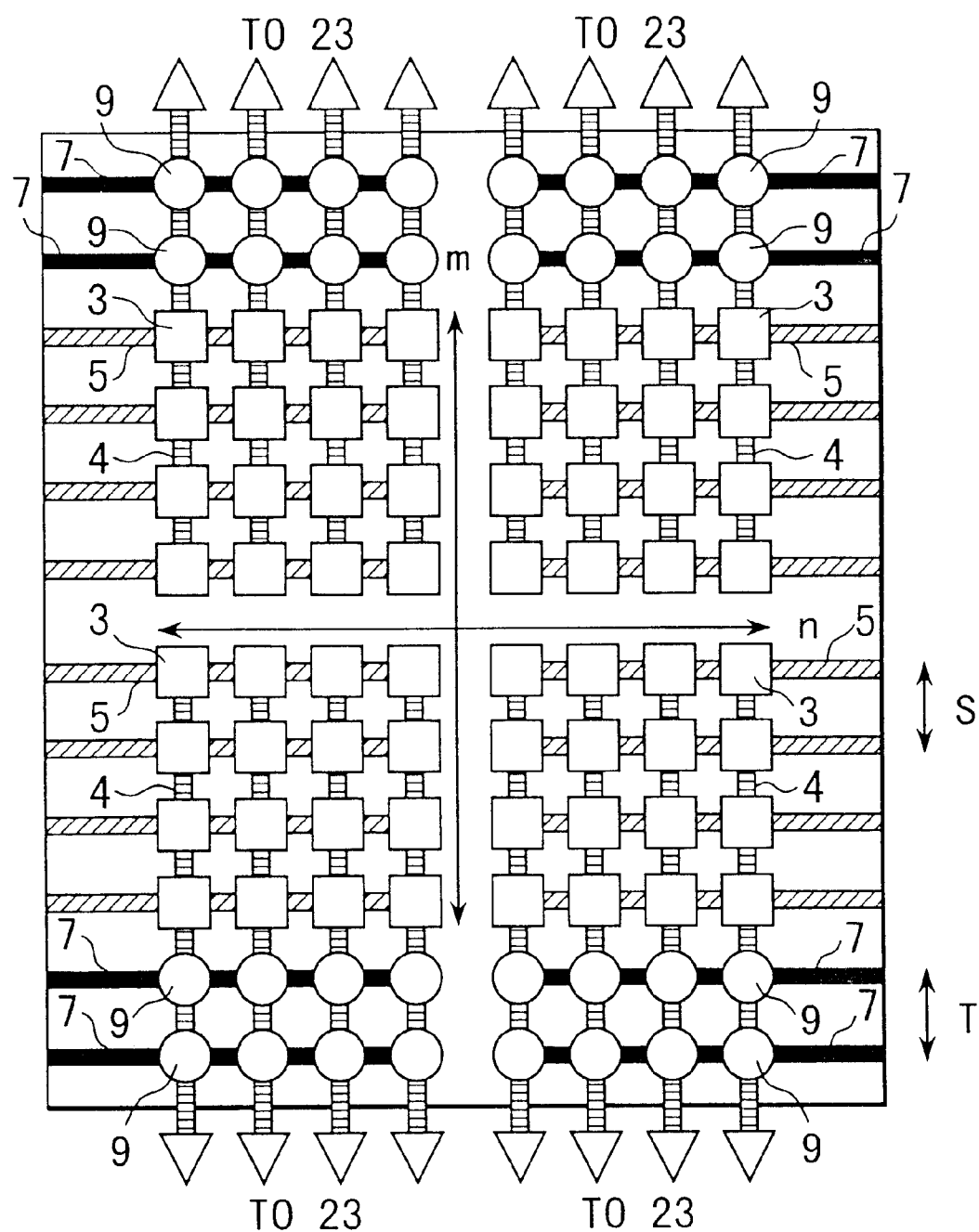
Figure 21:
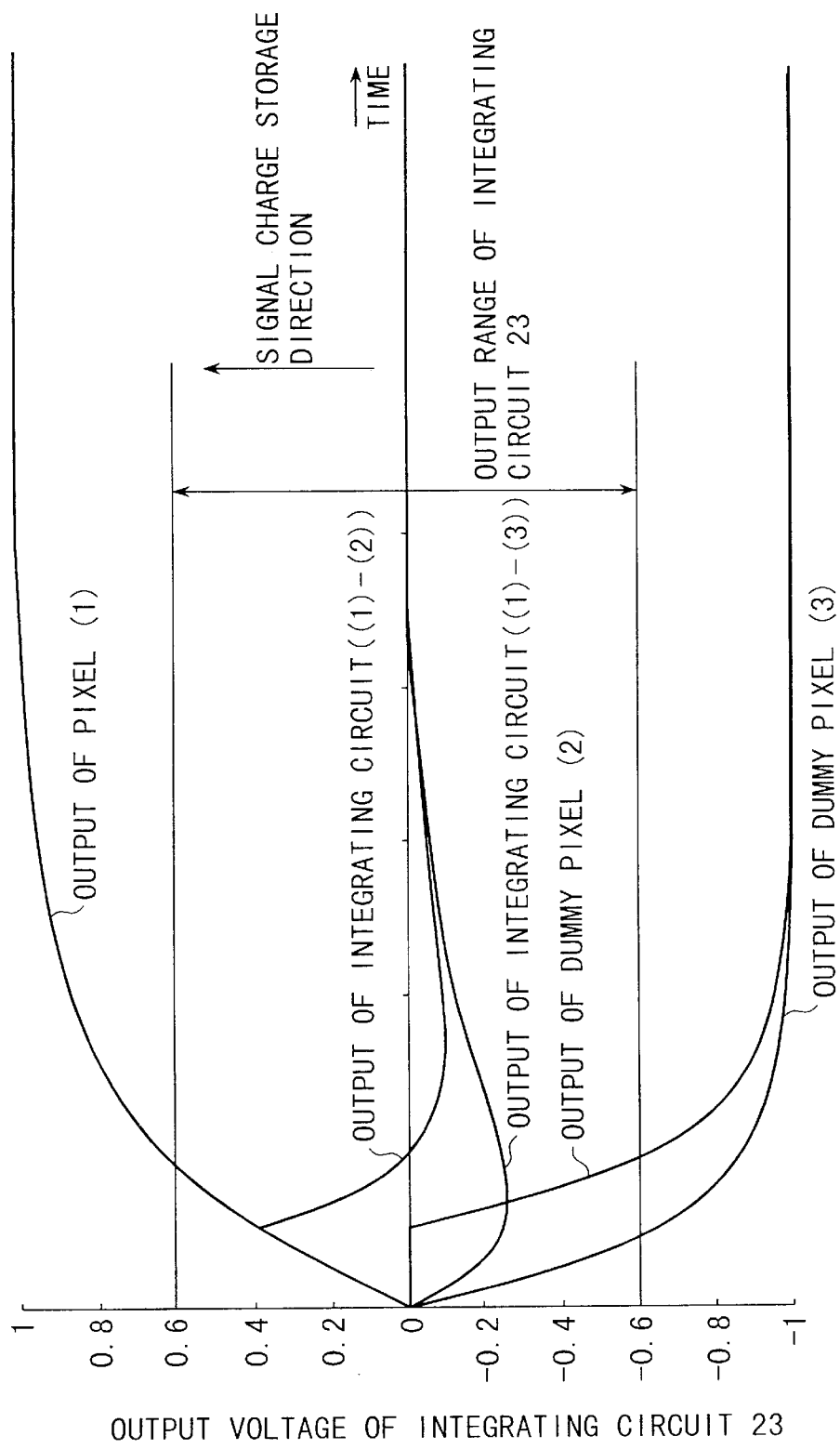
FIG. 21 is a graph showing the allowance of the dummy pixel with respect to the output error in the sixth embodiment.

As shown in FIG. 14, in the first to fifth embodiments, an array of a plurality of pixels 3 and a dummy pixel 9 is designed to form one section. By contrast, in the sixth embodiment, an array of a plurality of pixels 3 and dummy pixel 9 is designed to form a plurality of sections.

As shown in FIGS. 15 to 19, two or four sections are formed. Depending on the size of the detection field, signals may be read from the two, up and down directions, or the vertical select lines may be driven from the two, right and left directions. Since signals on the vertical select lines 5 suffer differences in the way they become blunt in units of sections, the adjustment block control lines 7 must be independently controlled in units of sections. Also, a plurality of adjustment controllers may be connected to a single signal line 4.

The dummy pixel (adjustment block) 9 which is similar to a normal pixel is connected to the adjustment block control line 7. A characteristic feature of the dummy pixel 9 is that it does not store any signal charge. When any signal charge is stored in this dummy pixel 9, an offset of the TFT in each pixel 3 cannot be normally canceled. For this reason, the dummy pixel 9 has no photoelectric conversion element or a photoelectric conversion element is not connected to the TFT if it has a photoelectric conversion element. Also, the adjustment TFT preferably has the same structure as the read TFT, and a structure in which capacitances that are involved in generation of charge injection as a cause of an offset, i.e., the capacitance between the signal line 4 and vertical select line 5 and the capacitance between the signal line 4 and adjustment block control line 7 are equal to each other (FIGS. 20A to 20D). As for the pixel capacitance of the dummy pixel 9, some choices are available: the TFT of the dummy pixel has a pixel capacitance; the TFT is connected to a constant potential; the TFT has an open terminal; and so forth (FIG. 20D).

Also, the signals on the vertical select lines 5 and those on the adjustment block control lines 7 in the individual sections must be adjusted. This adjustment is implemented by controlling the ON/OFF switching timing, time constant, amplitude, and voltage value. Ideally, the time constants and timings of the signals on the vertical select lines 5 and adjustment block control lines 7 should match, but it is difficult to match them perfectly. Also, correction must be done in units of signals on a plurality of vertical select lines 5 and at least one adjustment block control line 7, and it is hard to match the timing and time constant with those of signals on all the vertical select lines 6 using a predetermined adjustment block control line 7, in consideration of variations of the vertical select lines 5. In practice; the signals need only be adjusted not to be saturated in the subsequent circuits such as integrating circuits and the like. In this case, the output value of each integrating circuit has a peak in a transient state, and the signals need only be adjusted so that the peak does not reach saturation.

The amplitude of the signal on each adjustment block control line 7 varies depending on the number of vertical select lines 5 to be turned on at the same time, and the associated capacitance. The associated capacitance is that between the vertical select line 5 and signal line 4. Let Cgs be this capacitance, Cgs·sub be the capacitance between the adjustment block control line 7 and signal line 4, Von and Voff be the ON and OFF voltages of the vertical select line 5, and Von·sub and Voff·sub be the ON and OFF voltages of the adjustment block control line 7. Ideally then, if Von·sub and Voff·sub are selected to satisfy:

(Von sub−Voff·sub)×Cgs·sub=(Von−Voff)×Cgs an offset across each vertical select line 5 can be canceled.

When S (S is a natural number) vertical select lines 5 are simultaneously turned on, and an offset is canceled using T (T is a natural number) adjustment control lines 7, Von·sub and Voff·sub can be selected to satisfy:

T×(Von·sub−Voff·sub)×Cgs·sub=S×(Von−Voff)×Cgs

Seventh Embodiment

Figure 22:
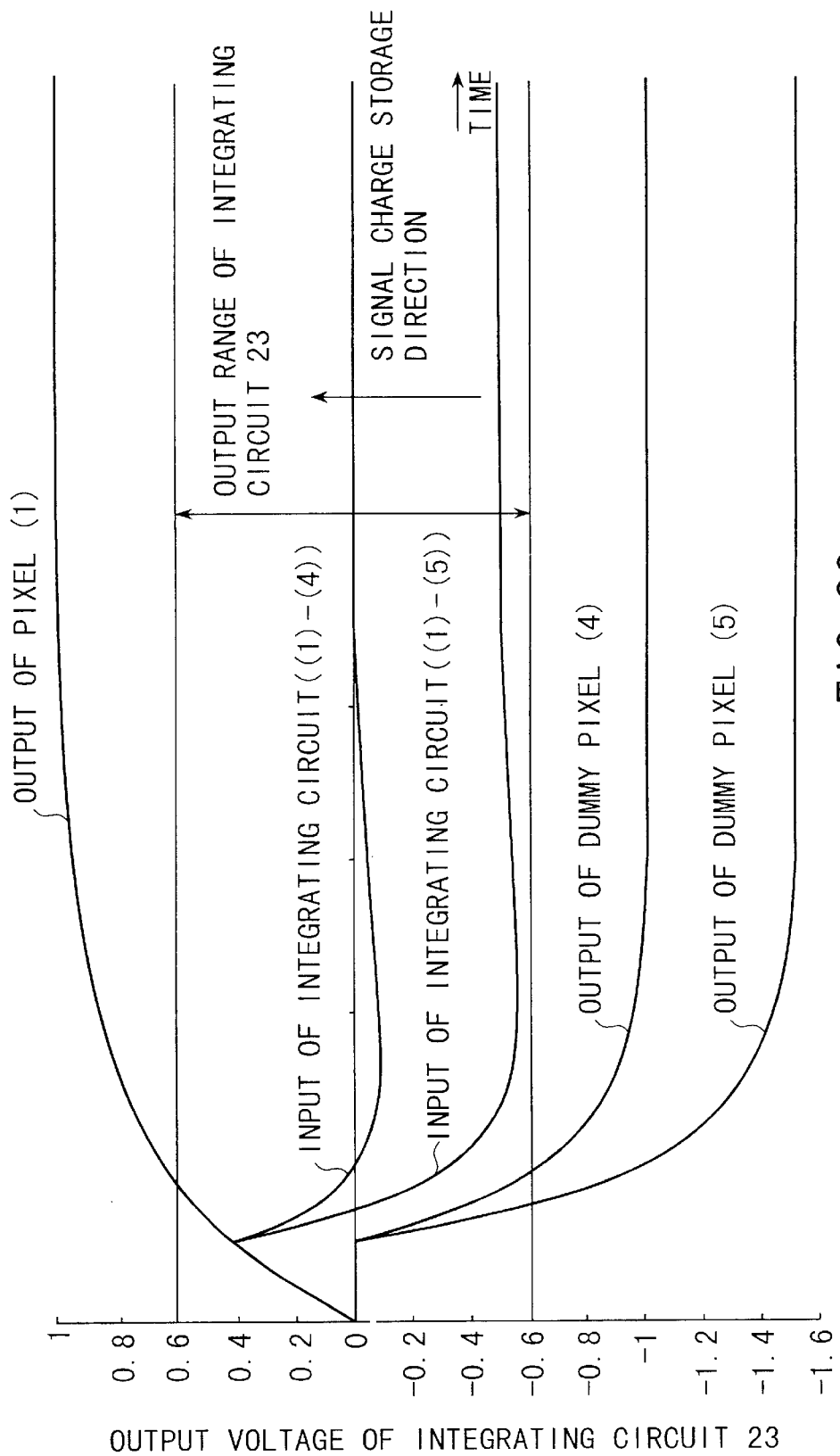
FIG. 22 is a graph for explaining the operation according to the seventh embodiment of the present invention.

If no signal is stored in a given pixel 3, the integrating circuit generates nearly zero output. When a signal charge is stored in only one direction, and the integrating circuit can generate both positive and negative outputs, nearly half the range is used, i.e., the dynamic range is wasted. Hence, the ON and OFF voltages of the adjustment block control line 7 are adjusted to generate a charge having a polarity opposite to that of a signal charge, thus fully utilizing the dynamic range of the integrating circuit (FIG. 22).

For example, when offset adjustment of the integrating circuit is to be done, the ON and OFF voltages Von·sub, Voff·sub of the adjustment block control line 7 are shifted to Von·sub', Voff·sub' on the basis of shifting voltage ΔVon·off·sub.

ΔVon·sub'−Voff·sub'=ΔVon·sub−Voff·sub+ΔVon·off·sub

The shifting voltage ΔVon·off·sub is set on the basis of the capacitance Cint of the integrating circuit, the offset voltage ΔV, and the Cgs·sub.

ΔV×Cint=ΔVon·off·sub×Cgs sub

Eighth Embodiment

Figure 23:
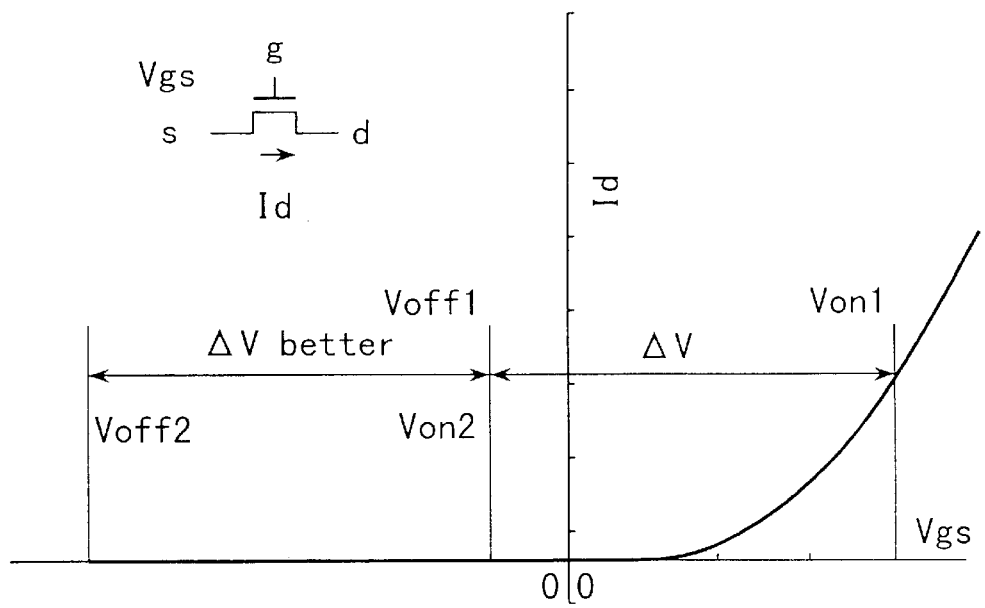
FIG. 23 is a graph showing an appropriate range of a gate signal with respect to a TFT of a dummy pixel in the eighth embodiment of the present invention.

Note that the amplitude can be determined by the above relation. However, as for the ON/OFF voltage values of the adjustment block control line 7, even the ON voltage can be set to be sufficiently small so that the adjustment control TFT can always operate in the OFF region (a region with a small leakage current: ΔV better in FIG. 23). With this control, the influence of the interior of the dummy pixel 9 connected to the adjustment block control line 7 can be minimized.

Ninth Embodiment

Figure 25:
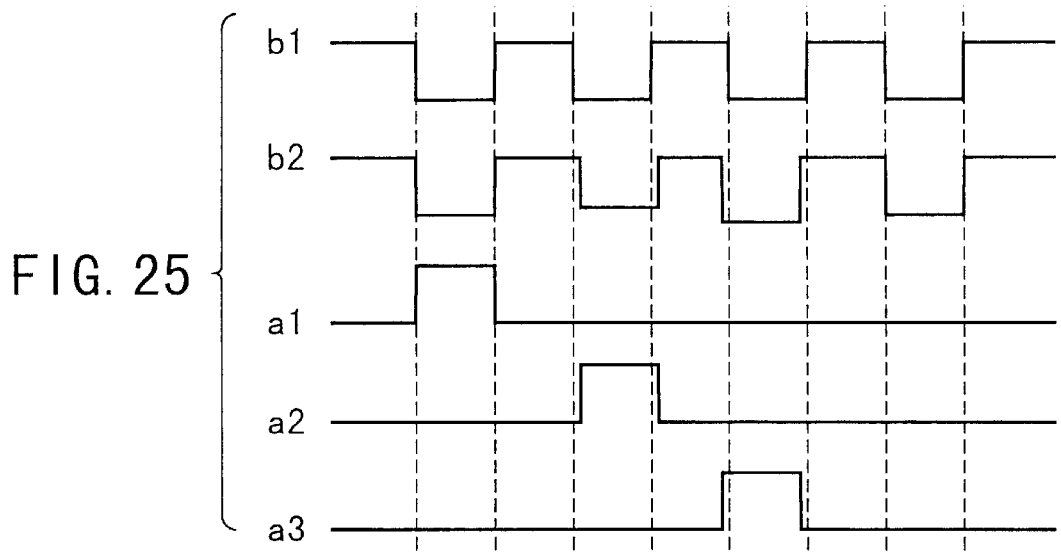
FIG. 25 is a timing chart for explaining the operation of the ninth embodiment.
Figure 24:
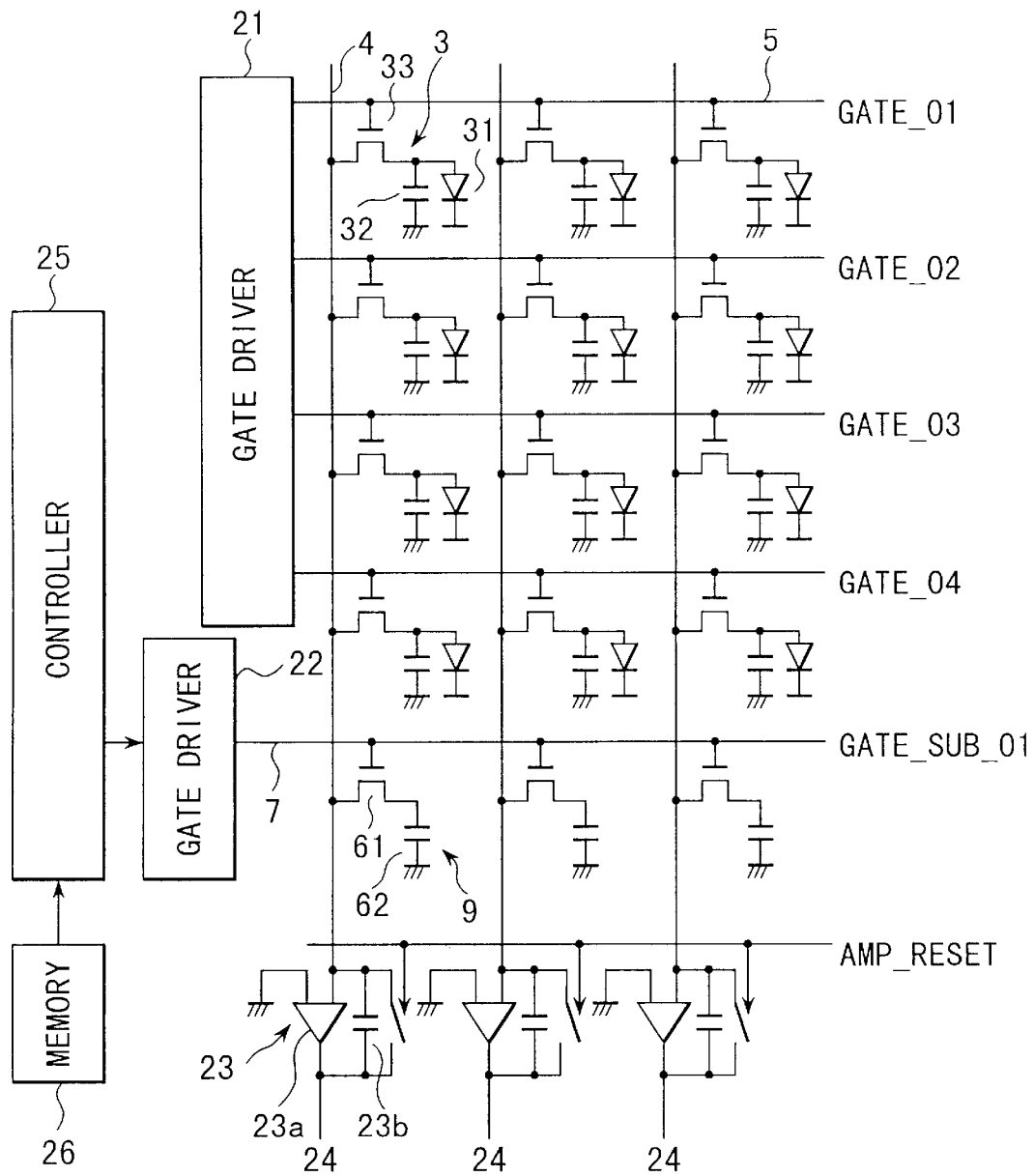
FIG. 24 is a circuit diagram showing the arrangement of a radiation detector according to the ninth embodiment of the present invention.

In fact, since the TFTs connected to each vertical select line 5 suffer variations, the gate driver that applies signals to the vertical select lines 5 suffers variations, or the distances from the pixels to the integrating circuits are different, the offset cannot often be satisfactorily corrected by the adjustment block control line 7 that is simply repetitively turned on/off. In such case, when the voltage of the adjustment control line 7 is adjusted in units of vertical select lines, slight variations can also be corrected. For this purpose, as shown in FIGS. 24 and 25, a memory 26 for holding driving information (time constants, timings) of the adjustment block control line 7 in units of vertical select lines 5 is provided, and voltages corresponding to the stored information must be generated under the control of the controller 25.

In all the embodiments described above, the output waveform is sampled to extract signal components from the output of each integrating circuit. As the sampling method, the following two methods are available.

In one method, the output waveform is sampled at two timings, i.e., a timing (S/H0) immediately before the read TFT is turned on and a timing (S/H1) immediately before the read TFT is turned off, and their difference is output. In this case, a sufficiently long signal transfer time from each pixel can be assured, but the signal may contain variations of charge injection due to each read TFT.

Figure 26:
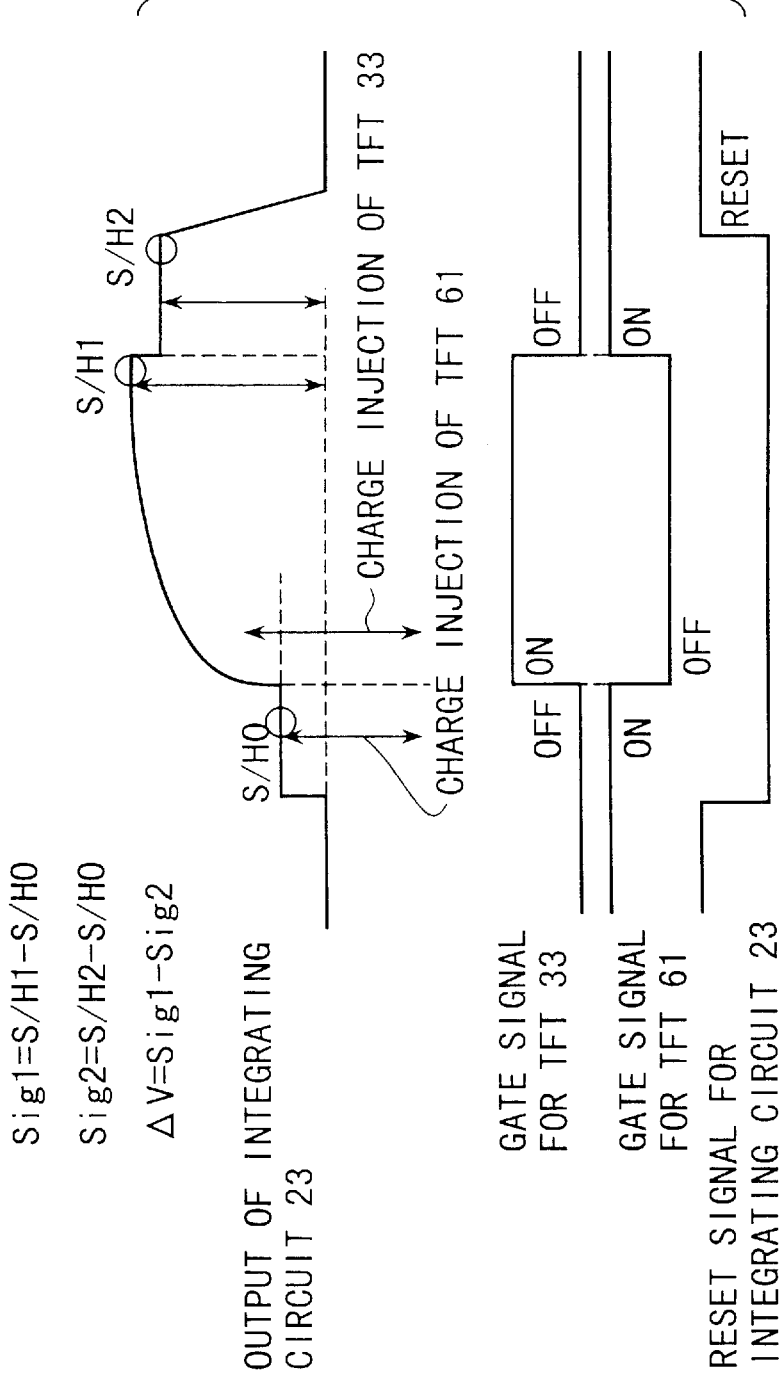
FIG. 26 is a timing chart for explaining the sampling operation of the output signal from the integrating circuit in the first to ninth embodiments.

In the other method, the output waveform is sampled at two timings, i.e., a timing (S/H0) immediately before the read TFT is turned on, and a timing (S/H2) after the read TFT is turned off, and their difference is output (as a signal), as shown in FIG. 26. In this method, the signal charge transfer time from each pixel becomes short, but since ON/OFF operations of the read TFT are included, charge injection by the read TFT is canceled by its own ON/OFF operations, thus canceling variations of the individual read TFTs.

However, when the integrating capacitor of each integrating circuit is small, the signal is saturated when the read TFT is turned on. Saturation caused by charge injection can be avoided by driving the adjustment TFT. That is, temporal saturation can be canceled by those of the vertical select lines 5 and adjustment block control line 7, and variations due to individual differences can be canceled by charge injections of the read and adjustment TFTs by respectively turning on/off those TFTs. In this manner, any in-plane distribution can be suppressed.

10th Embodiment

Figures 27A, 27B:
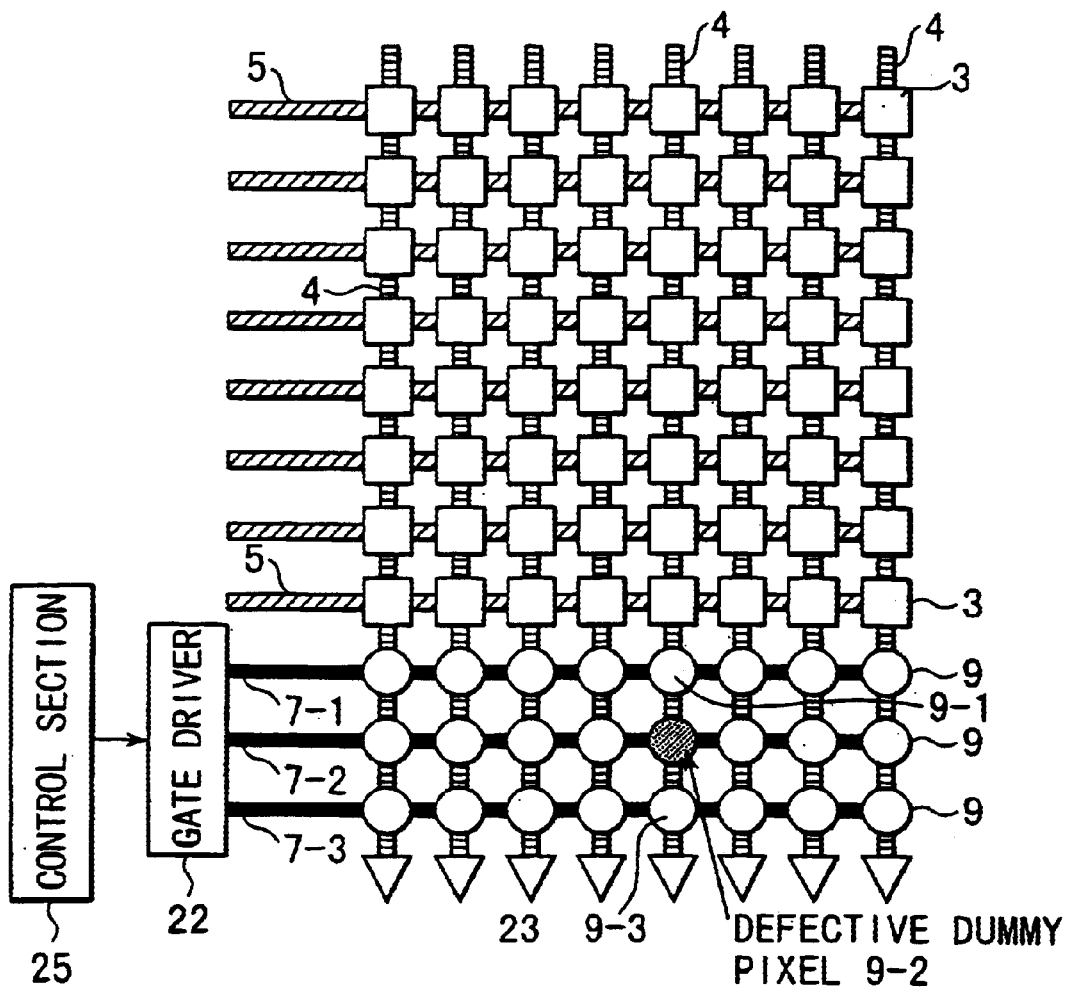
FIG. 27A is a diagram showing the arrangement of a radiation detector according to the 10th embodiment of the present invention.
FIG. 27B is a timing chart showing the gate signal supplied from a gate driver to a TFT of a dummy pixel under the control of a controller shown in FIG. 27A.

As shown in FIGS. 27A and 27B, when one section includes a plurality of adjustment block control lines 7, e.g., 7-1, 7-2, 7-3, if some of (not all) those adjustment block control lines 7 include any defective pixels (e.g., one of dummy pixels 9-1,9-2 or 9-3), and defective lines, such control lines 7 are not used, and the remaining adjustment block control lines 7 compensate for imperfect canceling of charge injection. In this case, to generate charges for the defective line, the amplitudes of the adjustments block control lines 7 used are amplified. If an adjustment block control line 7 including some defective pixel is used, the signal line 4 corresponding to the defective pixel is not normally corrected, and appears as a defective line in an image. That is, by inhibiting such defective adjustment block control line 7 from being used, the influence on the image can be minimized.

As a method of preventing saturation due to charge injection without using the adjustment block control line 7, a method of canceling charge injection by directly inputting a charge to the input terminal of the integrating circuit is available. As an example of this method, one terminal of a capacitor is connected to the input terminal of the integrating circuit, and the voltage at the other terminal of the capacitor is changed, thereby inputting a charge. As a method of changing the voltage, a method of supplying a constant pulse signal is known. As in the above case, when the timing, time constant, and amplitude are changed in units of pixels, more accurate correction can be achieved. In such case, a memory for saving pixel information and a driver for generating signals in accordance with saved information are required.

Modification 1

As shown in FIGS. 28A, 28B, and 28C, when a differential amplifier is used in each integrating circuit, a capacitance is connected to the input terminal different from the signal input, thus obtaining the same effect as described above.

Modification 2

Figure 29:
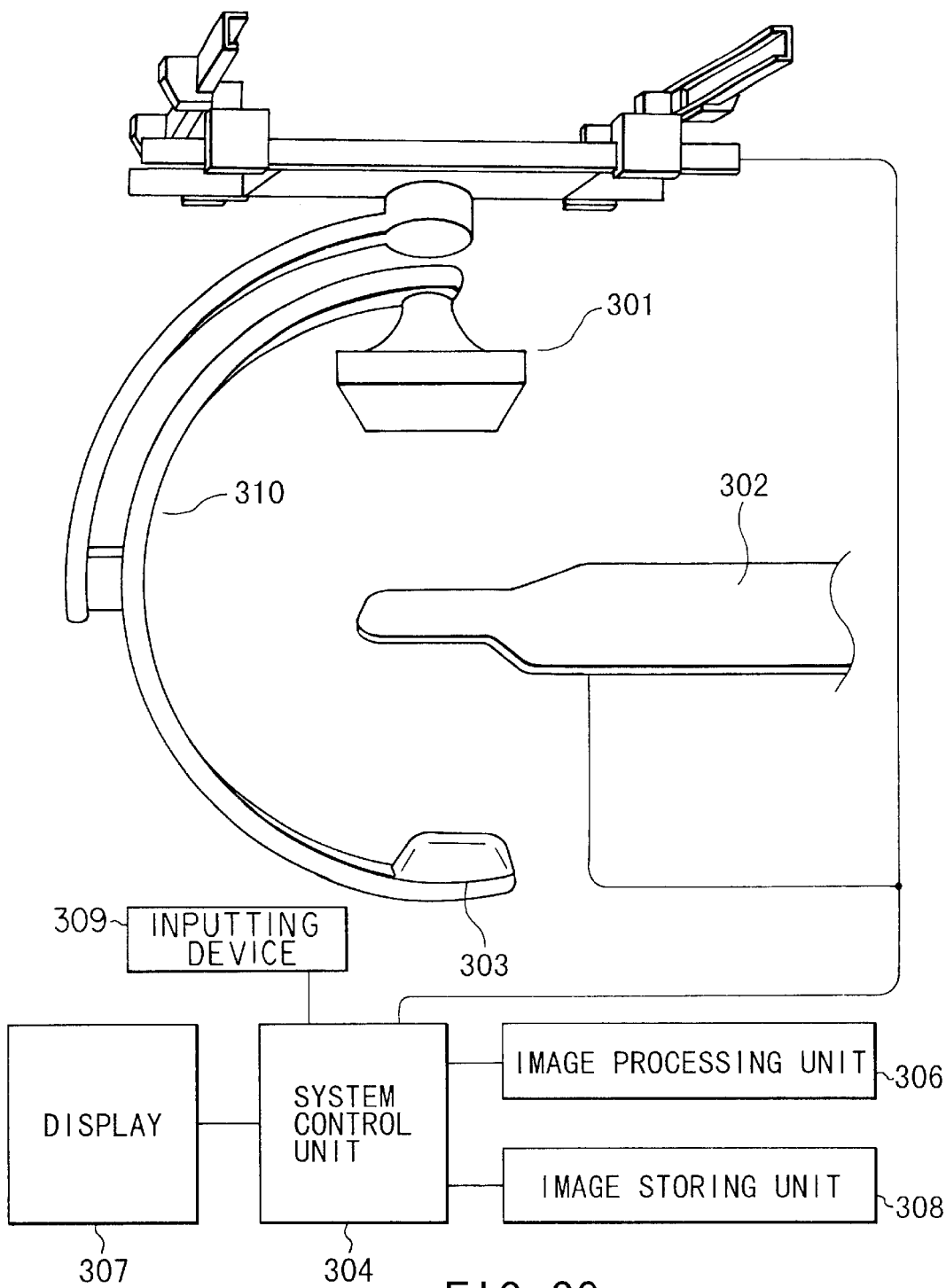
FIG. 29 is a diagram showing the arrangement of a radiation diagnosis apparatus that mounts the radiation detector of one of the first to 10th embodiments.

All the aforementioned radiation detectors can be applied to a radiation diagnosis apparatus, e.g., an X-ray diagnosis apparatus. FIG. 29 shows the arrangement of an X-ray diagnosis apparatus to which the radiation detector is applied. A radiation detector 301 is disposed on a side opposite to an X-ray generation source 303 for generating X-rays to sandwich a bed 302 on which a patient lies down therebetween. The X-ray generation source 303 and radiation detector 301 are held by a C-arm stand 310 to be able to arbitrarily change the angle with respect to the patient. The angle is controlled by a system control unit 304. The system control unit 304 is connected to the inputting device 309 to input the fluoroscopy/shot selecting command. The system control unit 304 controls X-ray radiation conditions and image acquisition conditions of the detector 301 in accordance with the input command. A display 307 displays images acquired by the radiation detector 301, and those processed by an image processing unit 306. An image storing unit 308 stores images acquired by the radiation detector 301, and those processed by the image processing unit 306.

The system control unit 304 supplies a control signal for synchronizing the X-ray generation sequence of the X-ray generation source 303 with the image acquisition sequence of the radiation detector 301 to the X-ray generation source 303 and radiation detector 301. Also, the system control unit 304 selects the relationship between the driving speed and resolution in accordance with the input fluoroscopy/shot selecting command, and supplies control signals for setting the number of vertical select lines 5 to be simultaneously turned on, the number of control lines 7 to be simultaneously turned on, the driving voltage of each vertical select line 5, and that of each control line 7 to the controller 25 of the radiation detector 301. The number of vertical select lines 5 simultaneously turned on, the number of control lines 7 simultaneously turned on, the driving voltage of each vertical select line 5, and the driving voltage of each control line 7 may be input by the input device 309. These control signals can be either signals for directly determining the voltages and the numbers of lines to be driven, and signals for indirectly determining them by selecting a driving mode of the detector 301. Note that the indirect control signals are converted into direct signals by the controller 25 in the detector 301.

In this manner, optimal offset cancel functions in units of various driving modes can be provided to the detector 301, and images that the operator wants can be acquired.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radiation detector comprising
   charge conversion elements;
   capacitors respectively connected to the charge conversion elements;
   first switching elements respectively connected to the capacitors;
   signal lines connected to the first switching elements;
   second switching elements connected to the signal lines; and
   a control circuit which controls the ON/OFF action of the first and second switching elements to cause the first and second switching elements to operate in opposite phase.

2. A detector according to claim 1, wherein charges other than the signal charges stored in said capacitors are discharged from said second switching elements.

3. A detector according to claim 1, wherein said second switching elements are formed on the same circuit board as said first switching elements.

4. A detector according to claim 1, wherein said first and second switching elements are thin-film transistors.

5. A detector according to claim 1, wherein said second switching elements are formed by same processes as said first switching elements.

6. A radiation detector comprising:
   charge conversion elements configured to convert incoming radiation into charges;
   capacitors configured to store converted charges;
   read switching elements configured to read the stored charges;
   integrating circuits configured to integrate the read charges;
   adjustment switching elements configured to adjust signals read from said capacitors to said integrating circuits via said read switching elements;
   a driver for driving said read switching elements and said adjustment switching elements; and
   a controller for controlling said driver to operate said read switching elements 180° out of phase with said adjustment switching elements.

7. A detector according to claim 6, wherein said adjustment switching elements are inserted between said read switching elements and said integrating circuits.

8. A detector according to claim 6, wherein said read switching elements and said adjustment switching elements are respectively thin-film transistors.

9. A detector according to claim 6, wherein said controller supplies a reset signal to said integrating circuits during a period other than a period including an OFF period of said adjustment switching elements.

10. A detector according to claim 6, wherein each of said adjustment switching elements has a charge non-storage structure on a side opposite to said integrating circuits.

11. A detector according to claim 6, wherein a terminal of each of said adjustment switching elements on a side opposite to said integrating circuits is set at a predetermined potential.

12. A detector according to claim 6, wherein a terminal of each of said adjustment switching elements on a side opposite to said integrating circuits is connected to ground.

13. A detector according to claim 6, wherein a terminal of each of said adjustment switching elements on a side opposite to said integrating circuits is connected to a capacitive element.

14. A detector according to claim 6, wherein a capacitance between each of signal lines that connect said capacitors to said integrating circuits and a control line that turns on/off said adjustment switching elements is substantially equivalent to a capacitance between each of the signal lines, and each of vertical select lines that turn on/off said read switching elements.

15. A detector according to claim 6, wherein said charge conversion elements, said capacitors, and said read switching elements are disposed at intersections between a plurality of signal lines and a plurality of vertical select lines, at least one adjustment switching element is connected to each of the signal lines, and said adjustment switching elements are commonly connected to at least one control line.

16. A detector according to claim 6, wherein said charge conversion elements said capacitors, and said read switching elements are disposed at intersections between a plurality of first signal lines and a plurality of first vertical select lines in a first section and are disposed at intersections between a plurality of second signal lines and a plurality of vertical select lines in a second section which neighbors the first section in a vertical direction, at least one adjustment switching element is connected to each of the first and second signal lines, and said adjustment switching elements are commonly connected to a first control line in the first section, and are commonly connected to a second control line in the second section.

17. A detector according to claim 6, wherein said charge conversion elements, said capacitors, and said read switching elements are disposed at intersections between a plurality of first signal lines and a plurality of first vertical select lines in a first section and are disposed at intersections between a plurality of second signal lines and a plurality of vertical select lines in a second section which neighbors the first section in a horizontal direction, at least one adjustment switching element is connected to each of the first and second signal lines, and said adjustment switching elements are commonly connected to a first control line in the first section, and are commonly connected to a second control line in the second section.

18. A detector according to claim 6, wherein said charge conversion elements, said capacitors, and said read switching elements are disposed at intersections between a plurality of signal lines and a plurality of vertical select lines, a predetermined number of adjustment switching elements are connected to each of the signal lines, and said adjustment switching elements are commonly connected to control lines in units of the predetermined number of adjustment switching elements.

19. A detector according to claim 18, wherein said controller individually adjusts applied voltages of the control lines.

20. A detector according to claim 18, wherein said control unit sets the number of control lines to which voltages are applied at the same time to be equal to the number of vertical select lines to which voltages are applied at the same time.

21. A detector according to claim 18, wherein said controller sets ON and OFF voltages for said read switching elements and said adjustment switching elements in units of elements.

22. A detector according to claim 18, wherein said controller changes applied voltages of the control lines in accordance with the respective vertical select lines.

23. A detector according to claim 18, wherein said controller selects applied voltages of the control lines from a voltage range in which said adjustment switching elements are OFF.

24. A detector according to claim 18, wherein a capacitance formed between each of the signal lines and each of the vertical select lines is substantially equal to a capacitance formed between each of the signal lines and each of the control lines, and said controller controls ON and OFF voltages of each read switching elements and ON and OFF voltages of said adjustment switching elements to make a product of a difference between the ON and OFF voltages of the read switching element and the number of vertical select lines to which voltages are applied at the same time to be substantially equivalent to a product of a difference between the ON and OFF voltages of the adjustment switching element and the number of control lines to which voltages are applied at the same time, upon turning on/off said read switching elements and said adjustment switching elements.

25. A detector according to claim 18, wherein said controller compensates for a defect of a given adjustment switching element using other adjustment switching elements connected to the same signal line as the defective adjustment switching element.

26. A detector according to claim 6, wherein an output from each of said integrating circuits is sampled twice, once immediately before said reading switching elements are turned on and once immediately before said reading switching elements are turned off.

27. A detector according to claim 6, wherein an output from each of said integrating circuits is sampled twice, once immediately before said reading switching elements are turned on and once immediately after said reading switching elements are turned off.

28. A radiation detector comprising:
   charge conversion elements configured to convert incoming radiation into charges;
   capacitors configured to store converted charges;
   read switching elements configured to read the stored charges;
   integrating circuits configured to integrate the read charges;
   adjustment switching elements configured to adjust signals read from said capacitors to said integrating circuits via said read switching elements;
   a driver for driving said read switching elements and said adjustment switching elements; and
   a controller which controls said driver to operate said read switching elements 180° out of phase with said adjustment switching elements, wherein said controller sets a difference between ON and OFF voltages of said adjustment switching elements to be larger than a difference between ON and OFF voltages of said read switching elements.

29. A detector according to claim 28, wherein the difference between ON and OFF voltages of said adjustment switching elements is substantially equal to a voltage range that said integrating circuits can output.

30. A detector according to claim 28, wherein the difference between ON and OFF voltages of said adjustment switching elements is shifted in accordance with $$Von\text{·}sub' - Voff\text{·}sub' = Von\text{·}sub - Voff\text{·}sub + \Delta Von\text{·}off\text{·}sub$$

wherein Von·sub is the ON voltage,

Voff·sub is the OFF voltage,

Von·sub' is a shifted ON voltage,

Voff·sub' is a shifted OFF voltage, $\Delta$Von·off·sub is a shifting voltage, and the shifting voltage $\Delta$Von·off·sub is set in accordance with $$\Delta V \times Cint = \Delta Von\text{·}off\text{·}sub \times Cgs\ sub$$

wherein Cint is a capacitance of said integrating circuit, $\Delta V$ is a offset voltage, Cgs sub is a capacitance between control lines for said adjustment switching elements and signal lines.

* * * * *